(12) United States Patent
Yura et al.

(10) Patent No.: US 8,084,924 B2
(45) Date of Patent: Dec. 27, 2011

(54) PIEZOELECTRIC/ELECTROSTRICTIVE FILM ELEMENT HAVING WAVY GRAIN BOUNDARIES

(75) Inventors: Yukinobu Yura, Nagoya (JP); Nobuyuki Kobayashi, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 358 days.

(21) Appl. No.: 12/397,476

(22) Filed: Mar. 4, 2009

(65) Prior Publication Data

US 2009/0236946 A1    Sep. 24, 2009

(30) Foreign Application Priority Data

| Mar. 21, 2008 | (JP) | ................................. 2008-074427 |
| Jun. 10, 2008 | (JP) | ................................. 2008-152099 |
| Nov. 27, 2008 | (JP) | ................................. 2008-303234 |
| Dec. 12, 2008 | (JP) | ................................. 2008-317328 |

(51) Int. Cl.
*H01L 41/187* (2006.01)
(52) U.S. Cl. ............. 310/358; 252/62.9 R; 252/62.9 PZ
(58) Field of Classification Search .................. 310/358; 252/62.9 R, 62.9 PZ
See application file for complete search history.

(56) References Cited

U.S. PATENT DOCUMENTS

| 5,032,559 A * | 7/1991 | McSweeney et al. ......... 501/137 |
| 5,126,615 A * | 6/1992 | Takeuchi et al. ............... 310/330 |
| 6,004,474 A * | 12/1999 | Takenaka et al. ........ 252/62.9 R |
| 6,097,133 A * | 8/2000 | Shimada et al. ............... 310/358 |
| 6,511,763 B1 * | 1/2003 | Kida et al. ..................... 428/699 |
| 6,639,340 B1 * | 10/2003 | Qiu et al. ....................... 310/358 |
| 7,381,671 B2 * | 6/2008 | Ogiso ............................. 501/135 |
| 7,414,352 B2 | 8/2008 | Nanataki et al. |
| 7,417,361 B2 | 8/2008 | Nanataki et al. |
| 7,514,848 B2 * | 4/2009 | Kobane et al. ................ 310/328 |
| 7,544,244 B2 * | 6/2009 | Sakashita et al. ................. 117/5 |
| 7,686,974 B2 * | 3/2010 | Priya ...................... 252/62.9 PZ |
| 2009/0072673 A1 * | 3/2009 | Fujii et al. ..................... 310/358 |
| 2009/0239041 A1 * | 9/2009 | Yura et al. ..................... 428/174 |
| 2010/0019624 A1 * | 1/2010 | Kaigawa et al. .............. 310/358 |

FOREIGN PATENT DOCUMENTS

| EP | 455342 A1 * | 11/1991 |
| JP | 2001181041 A * | 7/2001 |
| JP | 2005-183701 A1 | 7/2005 |
| JP | 2006-185940 A1 | 7/2006 |
| JP | 2006-185950 A1 | 7/2006 |
| JP | 2007223863 A * | 9/2007 |

* cited by examiner

*Primary Examiner* — Jaydi San Martin
(74) *Attorney, Agent, or Firm* — Burr & Brown

(57) ABSTRACT

An actuator includes a first electrode disposed on the top surface of a ceramic substrate (for example, zirconium oxide), a piezoelectric/electrostrictive substance disposed on the first electrode, and a second electrode disposed on the piezoelectric/electrostrictive substance, wherein the input of an electric power alters the volume of the piezoelectric/electrostrictive substance. The piezoelectric/electrostrictive substance contains a plurality of crystal grains that have a wavy structure composed of wavy grain boundaries including concave portions and convex portions. The crystal grains contain $ABO_3$ as the main component. The A site is Pb, and the B site contains such an amount of M that M becomes excessive after the piezoelectric/electrostrictive substance is formed (wherein M is at least one element selected from Mg, Ni, and Zn). The crystal grains of the piezoelectric/electrostrictive substance are oriented in the electric field direction, independently of the orientation of the substrate.

7 Claims, 12 Drawing Sheets

An image of a chemically polished cross section

A backscattered electron image of a surface

A secondary electron image of the surface

Experimental Example 10
(Common grain boundary)

PIEZOELECTRIC/ELECTROSTRICTIVE FILM ELEMENT HAVING WAVY GRAIN BOUNDARIES

BACKGROUND OF THE INVENTION

1. Field of the Invention

The present invention relates to a piezoelectric/electrostrictive film element.

2. Description of the Related Art

In one known piezoelectric/electrostrictive film element, a piezoelectric/electrostrictive substance formed on a ceramic substrate of zirconium oxide contains $Pb(Zr,Ti)O_3$ as the main component, and the number of crystals whose particle size in the width direction is larger than in the thickness direction is at least 70% of the number of crystals present in any cross section in the thickness direction (see, for example, Japanese Unexamined Patent Application Publication No. 2006-185940). This piezoelectric/electrostrictive film element has excellent piezoelectric and electrostrictive characteristics. Japanese Unexamined Patent Application Publication No. 2006-185950 proposes a piezoelectric/electrostrictive film element in which the number of crystal grains exposed at the top surface or the bottom surface is at least 80% of the number of crystal grains present in any cross section in the thickness direction, and the number of crystal grains exposed at both the top surface and the bottom surface is at least 50% of the number of crystal grains present in any cross section in the thickness direction. The piezoelectric/electrostrictive film element has excellent piezoelectric and electrostrictive characteristics and can resist a large number of bending displacements. Japanese Unexamined Patent Application Publication No. 2005-183701 proposes a piezoelectric element that is formed mainly of a piezoelectric ceramic having a perovskite structure, in which the average grain size of the piezoelectric ceramic as viewed from the lamination direction is larger than the thickness of a single piezoelectric ceramic layer, and the crystal grains are oriented. The piezoelectric element has excellent characteristics.

SUMMARY OF THE INVENTION

Thus, in the piezoelectric/electrostrictive film elements that include a piezoelectric/electrostrictive substance on zirconium oxide according to Japanese Unexamined Patent Application Publications No. 2006-185940 and No. 2006-185950, the aspect ratios of particles are made uniform in a predetermined direction to improve the piezoelectric and electrostrictive characteristics. However, the piezoelectric and electrostrictive characteristics are still insufficient. Hence, there is a need to further improve the piezoelectric and electrostrictive characteristics. The piezoelectric/electrostrictive film element according to Japanese Unexamined Patent Application Publication No. 2005-183701, in which the average grain size of the piezoelectric ceramic as viewed from the lamination direction is larger than the thickness of a single piezoelectric ceramic layer, often has shorts or dielectric breakdown, although the causes are not clear.

In view of the situations described above, it is an object of the present invention to provide a piezoelectric/electrostrictive film element that includes a piezoelectric/electrostrictive substance formed on a ceramic substrate and has improved piezoelectric and electrostrictive characteristics. It is another object of the present invention to provide a piezoelectric/electrostrictive film element that has a lower frequency of shorts, as well as improved piezoelectric and electrostrictive characteristics.

As a result of diligent research to achieve the objects described above, the present inventors completed the present invention by finding that when crystal grains include an oxide having a general formula of $ABO_3$ as the main component, in which the A site is Pb and the B site contains such an amount of M that M becomes excessive after firing (wherein M is at least one element selected from Mg, Ni, and Zn), and when the crystal grains have wavy grain boundaries including concave portions and convex portions, the crystal grains are oriented while particular crystal faces of the crystal grains are uniformly aligned, so that a piezoelectric/electrostrictive film element including the crystal grains has a lower frequency of shorts or dielectric breakdown, as well as improved piezoelectric and electrostrictive characteristics.

According to one aspect of the present invention, a piezoelectric/electrostrictive film element includes a ceramic substrate, electrodes, and a piezoelectric/electrostrictive substance formed on the ceramic substrate or on one of the electrodes disposed on the ceramic substrate, the piezoelectric/electrostrictive substance including a plurality of crystal grains that have a wavy structure composed of wavy grain boundaries in cross section, the wavy grain boundaries including concave portions and convex portions, the concave portions and the convex portions mating with convex portions and concave portions of adjacent crystal grains, respectively.

According to another aspect of the present invention, a piezoelectric/electrostrictive film element includes a ceramic substrate, electrodes, and a piezoelectric/electrostrictive substance that contains a plurality of crystal grains and is formed on the ceramic substrate or on one of the electrodes disposed on the ceramic substrate, wherein the piezoelectric/electrostrictive substance is produced through the step of forming a piezoelectric/electrostrictive substance, which includes a raw material preparation substep of preparing first inorganic particles that contain as the main component an oxide that has a general formula of $ABO_3$ and satisfies the following Equation 1, wherein z is in the range of $0.002 \leq z \leq 0.42$, a first shaping substep of applying the first inorganic particles to the ceramic substrate or to one of the electrodes disposed on the ceramic substrate to form a flat inorganic particle layer, and a first firing substep of firing the inorganic particle layer to grow the crystal grains:

$$a \times Pb(M'_{1/3},Nb_{2/3})O_3 + b \times PbTiO_3 + c \times PbZrO_3 + z \times M''O \quad \text{(Equation 1)}$$

(wherein $a+b+c=1$, and M' denotes at least one element selected from Mg, Ni and Zn and M" denotes at least one element selected from Mg, Ni and Zn).

A method for manufacturing a piezoelectric/electrostrictive film element is a method for manufacturing a piezoelectric/electrostrictive film element that includes a ceramic substrate and electrodes, and includes a step of forming a piezoelectric/electrostrictive substance, which includes a raw material preparation substep of preparing first inorganic particles that contain as the main component an oxide that has a general formula of $ABO_3$ and satisfies the following Equation 1, wherein z is in the range of $0.002 \leq z \leq 0.42$, a first shaping substep of applying the first inorganic particles to the ceramic substrate or to one of the electrodes disposed on the ceramic substrate to form a flat inorganic particle layer, and a first firing substep of firing the inorganic particle layer with another material to grow the crystal grains, the material having such volatility that the material volatilizes faster than the inorganic particle layer but does not volatilize beyond a predetermined evaporation level (hereinafter referred to as a "low volatilization condition"):

$$a \times Pb(M'_{1/3}, Nb_{2/3})O_3 + b \times PbTiO_3 + c \times PbZrO_3 + z \times M''O \quad \text{(Equation 1)}$$

(wherein a+b+c=1, and M' denotes at least one element selected from Mg, Ni and Zn and M" denotes at least one element selected from Mg, Ni and Zn).

The piezoelectric/electrostrictive film element has further improved piezoelectric and electrostrictive characteristics. While the reason for this improvement is not clear, it is assumed as described below. When crystal grains contain an oxide having a general formula of $ABO_3$ as the main component, in which the A site is Pb and the B site contains such an amount of M that M becomes excessive after firing (wherein M is at least one element selected from Mg, Ni, and Zn), the excess M substitutes for part of the main component of the crystal grains to form a defect. The defect promotes the diffusion of an element and thereby reduces the interfacial energy of a grain boundary. Thus, when the grains have wavy boundaries including concave portions and convex portions, the crystal faces of the grains are easily oriented in a predetermined direction. Since M is also an element of the main component, M rarely causes deterioration in piezoelectric characteristics. Accordingly, when the crystal grains are not oriented, depending on the direction of crystals, some crystals cannot exert the piezoelectric or electrostrictive effect, resulting in low efficiency. However, according to the present invention, crystals are oriented while particular crystal faces of the crystals are uniformly aligned. Thus, the crystals can function efficiently.

When the average grain size of a piezoelectric ceramic as viewed from the lamination direction is larger than the thickness of a single piezoelectric ceramic layer, a piezoelectric/electrostrictive film element often has shorts or dielectric breakdown. While the reason for shorts or dielectric breakdown is not clear, the reason is assumed as described below. In general, a grain boundary has a tendency to become a straight line (plane) to minimize the interfacial energy, and a grain surface has a tendency to become spherical to minimize the surface energy. The surface energy is often smaller than the interfacial energy. Thus, when the thickness is smaller than the particle size, for example, when the number of crystal grains in the thickness direction is one, the crystal grains probably have a tendency to form a surface rather than a grain boundary, that is, have a tendency to form a film defect. The formation of the film defect may cause a short or dielectric breakdown. In contrast, in a piezoelectric/electrostrictive film element according to the present invention, a component, such as MgO, moves owing to grain boundary diffusion in firing. This movement reduces the interfacial energy of a grain boundary, thus preventing the grain boundary from becoming a straight line. This movement also reduces the difference between the surface energy and the interfacial energy of the grain boundary. Thus, the grain boundary has a wavy structure. As described above, even when the thickness is smaller than the particle size, the wavy structure probably reduces the occurrence of a film defect, which often occurs in firing, and reduces the frequency of shorts or dielectric breakdown. In addition, the resulting increase in the degree of orientation improves the piezoelectric and electrostrictive characteristics.

In Equation 1, when M denotes at least two components, each of the two components may be contained in [a×Pb($M_x$, $Nb_y$)$O_3$] and [z×MO].

BRIEF DESCRIPTION OF THE DRAWINGS

FIG. 1A is a plan view and FIG. 1B is a cross-sectional view taken along the line A-A in FIG. 1A;

DETAILED DESCRIPTION OF THE INVENTION

Figure 1:
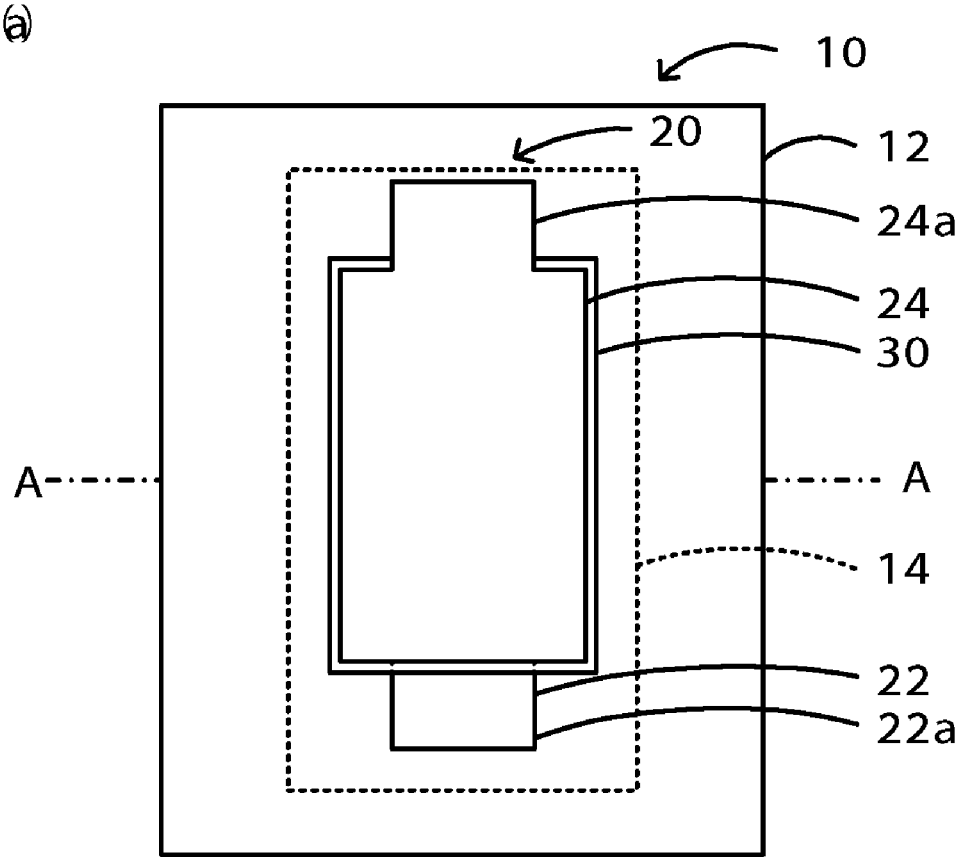
FIG. 1 illustrates explanatory drawings of an actuator 10 including a piezoelectric/electrostrictive film element 20 according to an embodiment of the present invention.
Figure 1:
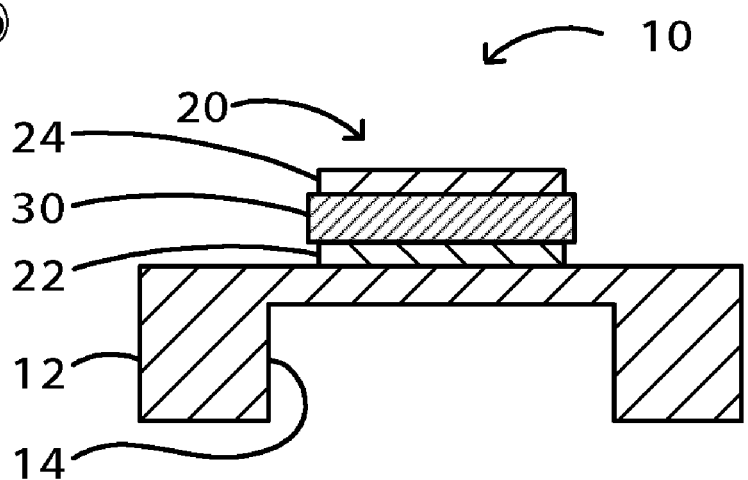

A piezoelectric/electrostrictive film element according to an embodiment of the present invention will be described below with reference to the drawings. FIG. 1 illustrates explanatory drawings of an actuator 10 including a piezoelectric/electrostrictive film element 20 according to an embodiment of the present invention; FIG. 1A is a plan view and FIG. 1B is a cross-sectional view taken along the line A-A in FIG. 1A. The actuator 10 according to the present embodiment includes a ceramic substrate 12 having a downward opening 14, a first electrode 22 disposed on the top surface of the ceramic substrate 12, a piezoelectric/electrostrictive substance 30 disposed on the first electrode 22, and a second electrode 24 disposed on the piezoelectric/electrostrictive substance 30, wherein the input of an electric power alters the volume of the piezoelectric/electrostrictive substance 30. The application of a voltage deforms the piezoelectric/electrostrictive substance 30 to exert pressure on a fluid (for example, liquid) in the opening 14 of the ceramic substrate 12.

Preferably, the ceramic substrate 12 is formed of a non-oriented polycrystalline substrate, which is composed of a plurality of non-oriented crystals. Preferably, the non-oriented polycrystalline substrate is formed of a ceramic containing at least one compound selected from the group consisting of stabilized zirconium oxide, aluminum oxide, magnesium oxide, mullite, aluminum nitride, and silicon nitride. More preferably, the non-oriented polycrystalline substrate is formed of a ceramic containing stabilized zirconium oxide because of its high mechanical strength and toughness. The term "stabilized zirconium oxide", as used herein, refers to zirconium oxide in which phase transition of crystals is suppressed by the addition of a stabilizer and includes partially stabilized zirconium oxide. Examples of stabilized zirconium oxide include zirconium oxide containing 1% to 30% by mol of stabilizer, such as calcium oxide, magnesium oxide, yttrium oxide, scandium oxide, ytterbium oxide, cerium oxide, or rare-earth metal oxide. Preferably, stabilized zirconium oxide contains yttrium oxide as a stabilizer, because the mechanical strength of a diaphragm is particularly improved. The yttrium oxide content ranges preferably from 1.5% to 6% by mol and more preferably from 2% to 4% by mol. Preferably, zirconium oxide further contains 0.1% to 5% by mol of aluminum oxide. The crystal phase of stabilized zirconium oxide may be a mixed phase of a cubic crystal form and a monoclinic crystal form, a mixed phase of a tetragonal crystal form and a monoclinic crystal form, or a mixed phase of a cubic crystal form, a tetragonal crystal form, and a monoclinic crystal form. Preferably, the crystal phase of stabilized zirconium oxide is principally a tetragonal crystal form or a mixed phase of a tetragonal crystal form and a cubic crystal form because of its high strength, toughness, and durability.

The first electrode 22 is rectangular and has a rectangular tab 22a for external connection at one end. The first electrode 22 may be formed of at least one metal selected from the group consisting of platinum, palladium, ruthenium, gold, silver, and alloys thereof. Among others, platinum and platinum alloys are preferred because of their high heat resistance in firing. The second electrode 24 is formed in the same manner as the first electrode 22, except that a tab 24a is disposed opposite to the tab 22a. The first electrode 22 may have a sandwich structure, a comb structure, or a tiger skin structure. When the piezoelectric/electrostrictive substance 30 is oriented so that a polar axis is included in a plane parallel to the ceramic substrate 12, the tiger skin or the comb structure are preferred, because the electric field direction is included in a plane parallel to the ceramic substrate 12. In this case, the piezoelectric/electrostrictive substance 30 can have excellent piezoelectric and electrostrictive characteristics, as compared with a non-oriented piezoelectric/electrostrictive substance. When the polar axis is oriented perpendicularly to the ceramic substrate 12, the sandwich structure as illustrated in FIG. 1 is more preferred, because the electric field direction coincides with the direction of the polar axis. The term "polar axis", as used herein, refers to the direction in which spontaneous polarization occurs owing to ionic displacement. Excellent piezoelectric characteristics can be achieved in the direction of the polar axis. For example, perovskite compounds have the polar axis in the c-axis direction. Layered compounds, such as $Bi_4Ti_3O_{12}$, have the polar axis in the in-plane direction. These are also applied to the second electrode 24.

Figure 2:
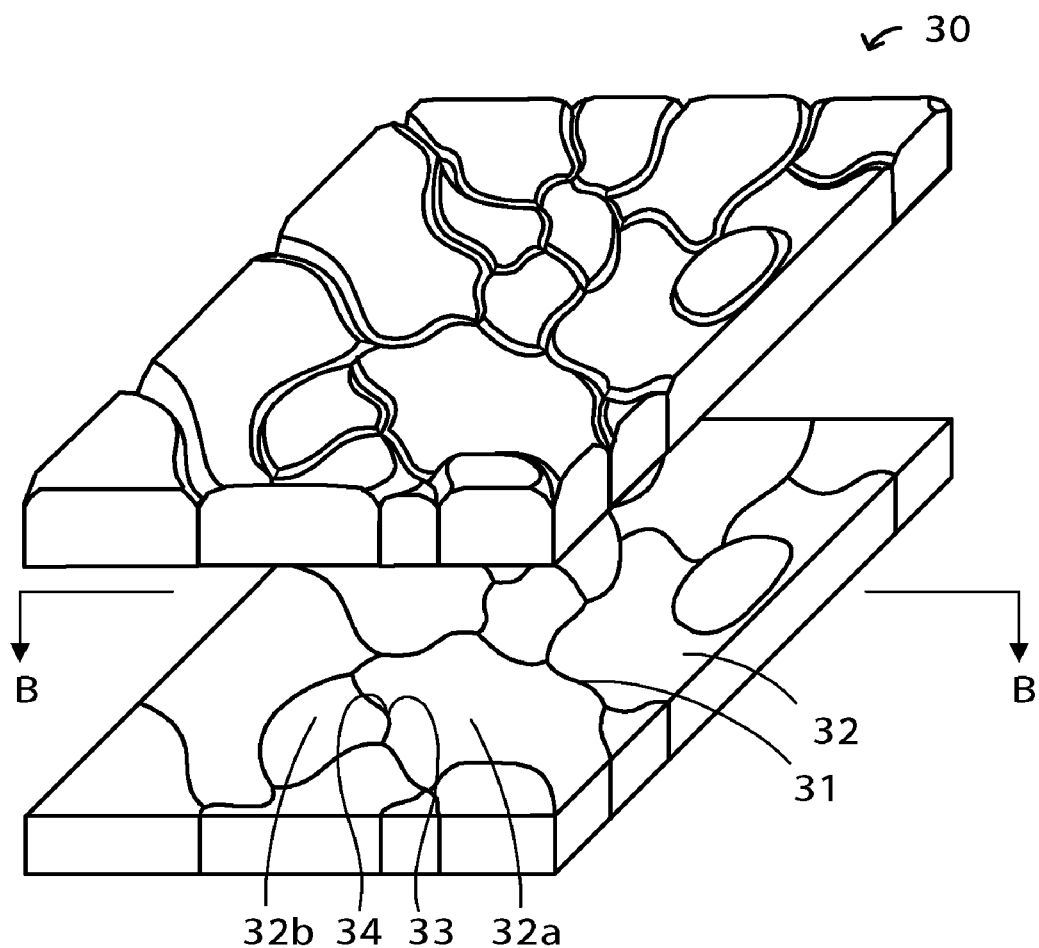
FIG. 2 is an explanatory drawing of a piezoelectric/electrostrictive substance 30 according to an embodiment of the present invention.
Figure 3:
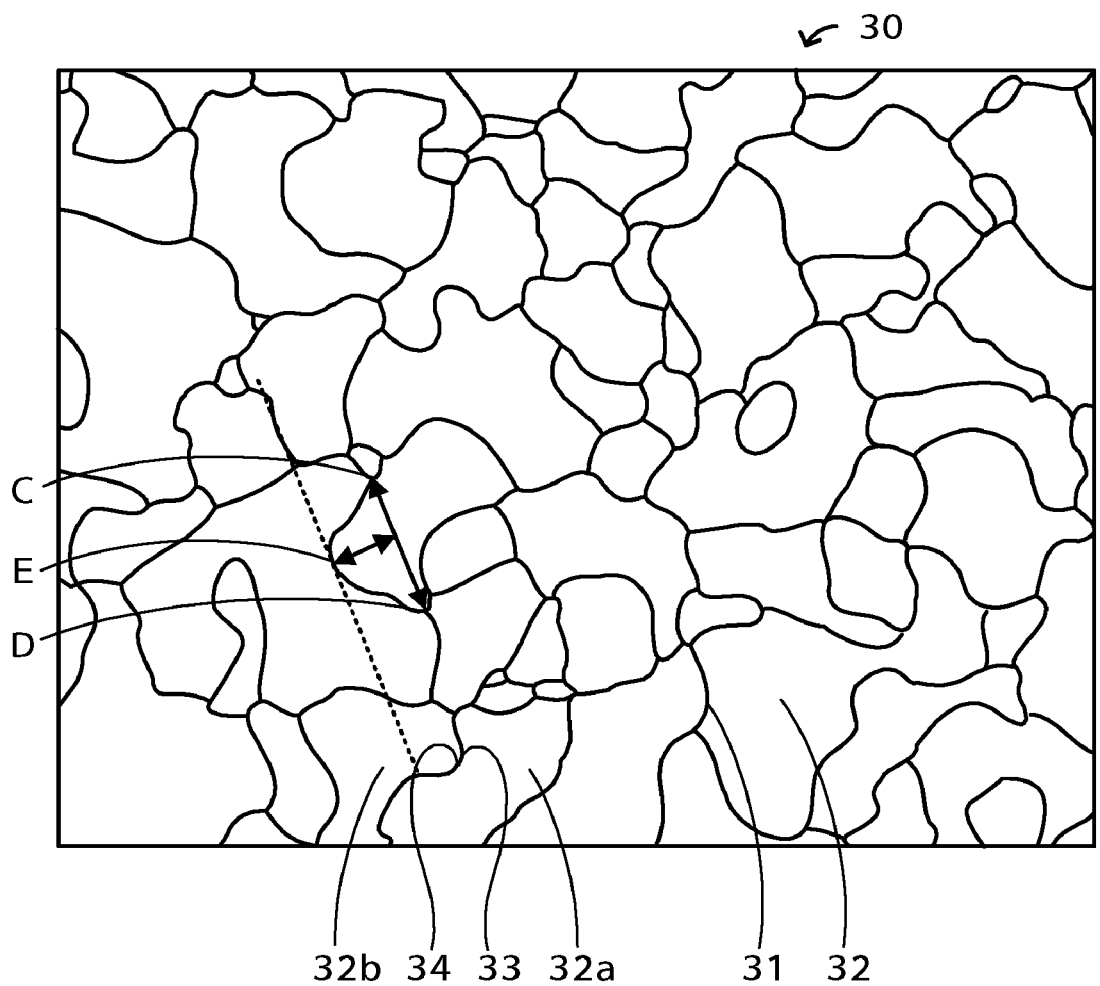
FIG. 3 is a plan view taken along the line B-B in FIG. 2.

The piezoelectric/electrostrictive substance 30 is rectangular and is disposed between the first electrode 22 and the second electrode 24. The piezoelectric/electrostrictive substance 30 is disposed on the ceramic substrate 12 with the first electrode 22 interposed therebetween. FIG. 2 is an explanatory drawing of a piezoelectric/electrostrictive substance 30 according to an embodiment of the present invention. FIG. 3 is a plan view taken along the line B-B in FIG. 2. As illustrated in FIGS. 2 and 3, the piezoelectric/electrostrictive substance 30 includes a plurality of crystal grains that have a wavy structure composed of wavy grain boundaries 31 in cross section. The wavy grain boundaries include concave portions and convex portions. The concave portions and the convex portions mate with convex portions and concave portions of adjacent oriented crystals 32, respectively. For example, as illustrated in FIG. 2, a concave portion 33 of an oriented crystal 32a mates with a convex portion 34 of an adjacent oriented crystal 32b. The convex portion 34 of the oriented crystal 32b mates with the concave portion 33 of the adjacent oriented crystal 32a. The phrase "in cross section", as used herein, does not mean practically viewing a cross section. In three-dimensional observation of a piezoelectric/electrostrictive substance 30 with a scanning electron microscope (SEM), when crystal grains having a spherical top surface overlap one another, a series of curved lines (curved surfaces) may be observed. However, this is not the case. The phrase "in cross section" means that it is sufficient if grain boundaries 31 composed of curved lines can be observed in the cross section.

The curvature of the wavy structure of the piezoelectric/electrostrictive substance 30 ranges preferably from 0.1 to 0.9 and more preferably from 0.3 to 0.8. At a curvature of at least 0.1, the piezoelectric/electrostrictive film element 20 has a lower frequency of shorts or dielectric breakdown. As illustrated in FIG. 3, the curvature is calculated in the following manner. First, the average grain size is determined from a SEM photograph in a visual field that includes 20 to 40 crystal grains. The average grain size is a mean value of the maximum lengths of crystal faces of all the crystal grains that are entirely included in the visual field (i.e., excluding grain fragments cut at the edge of the visual field). Five grains having a size larger than the average grain size are arbitrarily selected. In the selected grains, a first straight line is drawn between two triple points (i.e., where three adjacent grains meet) of adjacent grain boundaries (for example, points C and D in FIG. 3). A second straight line parallel to the first straight line is drawn as shown by the dotted line in FIG. 3. The second straight line is in contact with the grain boundary at the point E between the two triple points C and D. The length of the perpendicular line from the point E to the first straight line is measured. The ratio of the length of the perpendicular line to the length of the first straight line is calculated for all the grain boundaries of a selected grain. The maximum ratio is taken as the curvature of the crystal grain. The mean value of the curvatures of the five selected crystal grains is considered as the curvature of the piezoelectric/electrostrictive substance 30.

The piezoelectric/electrostrictive substance 30 is a ceramic film having a thickness in the range of 1 to 20 μm (5 μm in this embodiment). The piezoelectric/electrostrictive substance 30 contains a plurality of oriented crystals 32 having a particular crystal face oriented in a particular direction. The term "ceramic film", as used herein, does not mean a film just crystallized by heat treatment, but refers to a film in which crystal grains crystallized by heat treatment are further grown. The piezoelectric/electrostrictive substance 30 may be a monolayer or multilayer. The monolayer or multilayer can be identified by observing a cross section of the piezoelectric/electrostrictive film element 20. A monolayer piezoelectric/electrostrictive substance 30 may be a piezoelectric/electrostrictive substance 30 containing substantially one oriented crystal 32 in the thickness direction. The phrase "substantially one oriented crystal grain in the thickness direction", as used herein, means that even when part of the oriented crystals 32 overlap one another, most of the oriented crystals 32 do not overlap in the thickness direction. This phrase excludes the situation in which oriented crystals 32 overlap each other in most parts of a ceramic film including the intermediate part and only end parts of the ceramic film include a single crystal in the thickness direction. Since some of the oriented crystals 32 are not sufficiently grown to the thickness of the film or have crystal faces in different directions, overlap of oriented crystals 32 or oriented crystals 32 having crystal faces in different directions are locally present. However, in general, the number of oriented crystals 32 in the thickness direction is one. A part containing only one crystal grain is preferably at least 70%, more preferably at least 80%, and most preferably at least 90% of the area of the piezoelectric/electrostrictive substance 30.

The piezoelectric/electrostrictive substance 30 is produced through the step of forming a piezoelectric/electrostrictive substance, which includes a raw material preparation substep of preparing first inorganic particles that contain as the main component an oxide that has a general formula of $ABO_3$ and satisfies the following Equation 1, wherein z is in the range of $0.002 \leq z \leq 0.42$, a first shaping substep of applying the first inorganic particles to the ceramic substrate or to one of the electrodes disposed on the ceramic substrate to form a flat inorganic particle layer, and a first firing substep of firing the inorganic particle layer to grow the crystal grains. The first inorganic particles are prepared such that the fired inorganic particle layer contains a predetermined excessive amount of M component. More preferably, z is in the range of $0.06 \leq z \leq 0.1$. In this range, the piezoelectric and electrostrictive characteristics can be improved. The piezoelectric/electrostrictive substance 30 is substantially the same as a piezoelectric/electrostrictive substance manufactured through the step of forming a piezoelectric/electrostrictive substance, which includes a raw material preparation substep of preparing first inorganic particles that contain as the main component an oxide that has a general formula of $ABO_3$ and satisfies the equation of $\{a \times Pb(M_{x+z},Nb_y)O_{3+z} + b \times PbTiO_3 + c \times PbZrO_3\}$ ($a+b+c=1$, $x+y=1$, and M is at least one element selected from Mg, Ni, and Zn), wherein z is in the range of $0.01 \leq z \leq 2.67$ after firing, a first shaping substep of applying the first inorganic particles to the ceramic substrate or to one of the electrodes disposed on the ceramic substrate to form a flat inorganic particle layer, and a first firing substep of firing the inorganic particle layer to grow the crystal grains. More preferably, z is in the range of $0.17 \leq z \leq 1.67$. In this range, the piezoelectric and electrostrictive characteristics can be improved. Preferably, the piezoelectric/electrostrictive substance 30 is produced through the step of forming a piezoelectric/electrostrictive substance further including a lamination step of performing at least one coating substep and at least one second firing substep. The coating substep involves applying second inorganic particles containing Pb, M, Nb, Zr, and Ti to the fired inorganic particle layer after the first firing substep. The second firing substep involves firing the applied second inorganic particles at a predetermined temperature to grow crystal grains. Thus, after crystals containing an excessive amount of M component are grown in the first firing substep, the composition of second inorganic particles can be controlled to adjust the composition of the piezoelectric/electrostrictive substance 30. Preferably, the oxide having a general formula of $ABO_3$ has a perovskite structure. The term "main component", as used herein, means that the content of a composition of a three-component solid solution system having a general formula $ABO_3$ in Equation 1 is at least 70% by weight and preferably at least 90% by weight.

[Equation 1]

$$a \times Pb(M'_{1/3}, Nb_{2/3})O_3 + b \times PbTiO_3 + c \times PbZrO_3 + z \times M''O \quad \text{(Equation 1)}$$

(wherein $a+b+c=1$, and M' denotes at least one element selected from Mg, Ni and Zn and M" denotes at least one element selected from Mg, Ni and Zn).

Preferably, the piezoelectric/electrostrictive substance 30 has crystal faces oriented in a particular direction parallel to the electric field direction, that is, in a particular direction perpendicular to the surfaces of the first electrode 22 and the second electrode 24. The degree of orientation of the particular crystal faces in the piezoelectric/electrostrictive substance 30 is preferably at least 25%, more preferably at least 30%, still more preferably at least 50%, and most preferably at least 80%, as determined by the Lotgering method. At a degree of orientation of at least 25%, the piezoelectric and electrostrictive characteristics can be improved. The particular crystal faces may be an in-plane pseudo-cubic (100) plane of the piezoelectric/electrostrictive substance. The term "pseudo-cubic (100)" means that although isotropic perovskite oxides have a slightly distorted cubic structure, such as tetragonal, orthorhombic, or trigonal, because the distortion is very small, the slightly distorted cubic structure is assumed to be a cubic structure expressed by the Miller indices. The degree of orientation as determined by the Lotgering method is calculated by Equation 2 from an XRD diffraction pattern of oriented faces of the piezoelectric/electrostrictive substance 30. In Equation 2, $\Sigma I(hkl)$ is the sum of X-ray diffraction intensities of all the crystal planes (hkl) measured in the piezoelectric/electrostrictive substance 30, $\Sigma I_0(hkl)$ is the sum of X-ray diffraction intensities of all the crystal planes (hkl) measured in a non-oriented piezoelectric/electrostrictive substance having the same composition as the piezoelectric/electrostrictive substance 30, $\Sigma' I(HKL)$ is the sum of X-ray diffraction intensities of crystallographically equivalent particular crystal planes (for example, a (100) plane) measured in the piezoelectric/electrostrictive substance 30, and $\Sigma' I_0(HKL)$ is the sum of X-ray diffraction intensities of particular crystal planes measured in a non-oriented piezoelectric/electrostrictive substance having the same composition as the piezoelectric/electrostrictive substance 30.

[Equation 2]

$$\text{Degree of orientation} = \frac{\dfrac{\sum' I(HKL)}{\sum I(hkl)} - \dfrac{\sum' I_0(HKL)}{\sum I_0(hkl)}}{1 - \dfrac{\sum' I_0(HKL)}{\sum I_0(hkl)}} \times 100\% \quad \text{Equation (2)}$$

The piezoelectric/electrostrictive substance 30 exhibits a bending displacement of preferably at least 10% and more preferably at least 20% relative to a non-oriented piezoelectric/electrostrictive substance. A bending displacement of at least 10% results in more preferred piezoelectric and electrostrictive characteristics.

Figure 4:
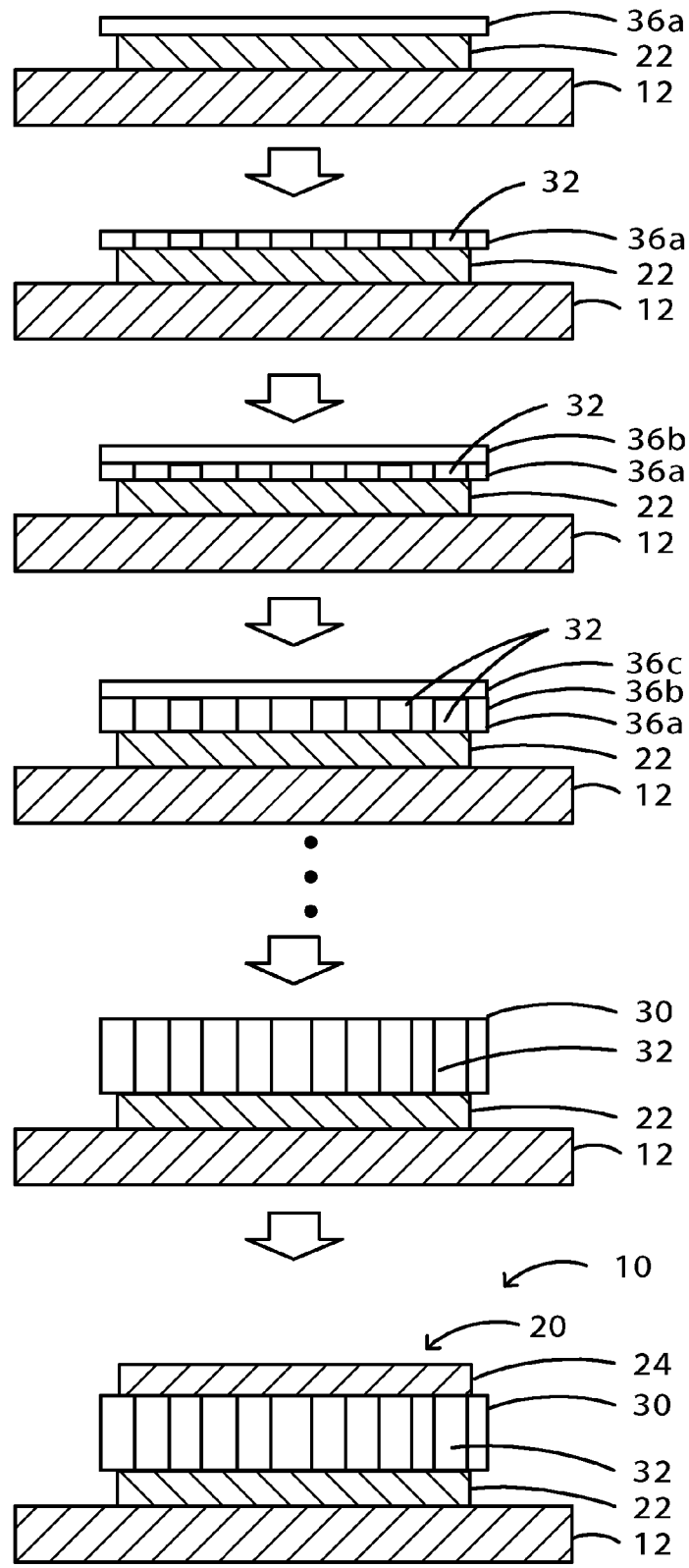
FIG. 4 is an explanatory drawing of a method for manufacturing a piezoelectric/electrostrictive film element 20 according to an embodiment of the present invention.

A method for manufacturing a piezoelectric/electrostrictive film element 20 will be described below. FIG. 4 is an explanatory drawing of a method for manufacturing a piezoelectric/electrostrictive film element 20 according to an embodiment of the present invention. From the top, FIG. 4 illustrates the step of shaping a first layer, the step of firing the first layer, the step of coating a second layer, the step of coating a third layer, the formation of the piezoelectric/electrostrictive substance 30, and the formation of the second electrode 24. As illustrated in FIG. 4, a method for manufacturing a piezoelectric/electrostrictive film element 20 may include (1) a first electrode forming step of forming a first electrode 22 on a ceramic substrate 12, (2) the step of forming a piezoelectric/electrostrictive substance, which includes a first forming step and a lamination step, the first forming step including a raw material preparation substep of preparing a raw material, that is, first inorganic particles, a first shaping substep of applying the first inorganic particles to the first electrode 22 to form a first layer 36a of a piezoelectric/electrostrictive substance 30, and a first firing substep of firing the first layer 36a to generate orientation-induced crystallization, the lamination step performing a coating substep and a second firing substep repeatedly to form a piezoelectric/electrostrictive substance 30 having a desired thickness, the coating substep involving applying inorganic particles to the orientation-induced crystallized layer formed in the first forming step, the second firing substep involving firing the inorganic particles to generate orientation-induced crystallization, and (3) a second electrode forming step of forming a second electrode 24 on the piezoelectric/electrostrictive substance 30.

(1) First Electrode Forming Step

A ceramic substrate 12 on which a first electrode 22 is to be formed is preferably fired at a temperature higher than heat treatment temperatures in the subsequent steps. Preferably, the ceramic substrate 12 is a ceramic that is not deformed or altered in quality by heat treatment. The ceramic substrate 12 may be a non-oriented polycrystalline substrate or an oriented polycrystalline substrate. Preferably, the ceramic substrate 12 is a non-oriented polycrystalline substrate. In this method for manufacturing a piezoelectric/electrostrictive film element 20, the degree of orientation of the piezoelectric/electrostrictive substance 30 can be increased independently of the type of the material or the orientation of the ceramic substrate 12. Thus, any material that resists heat treatment in the formation of the piezoelectric/electrostrictive film element 20 can be used for the ceramic substrate 12. Preferably, the ceramic substrate 12 is formed of a ceramic containing at least one compound selected from the group consisting of zirconium oxide, aluminum oxide, magnesium oxide, mullite, aluminum nitride, and silicon nitride. More preferably, the ceramic substrate 12 is mainly composed of zirconium oxide. Still more preferably, the ceramic substrate 12 is mainly composed of stabilized zirconium oxide. The ceramic substrate 12 is formed into a desired shape and fired. Preferably, the first electrode 22 may be formed of at least one metal selected from the group consisting of platinum, palladium, ruthenium, gold, silver, and alloys thereof. The first electrode 22 may be formed by applying a paste of the metal described above to the ceramic substrate 12 by the doctor blade method or screen printing and firing the paste. The thickness of the first electrode 22 depends on the thickness of the piezoelectric/electrostrictive substance 30. Preferably, the thickness of the first electrode 22 ranges from about 0.1 to 20 μm in view of the bending displacement of the piezoelectric/electrostrictive substance 30.

(2) Step of Forming Piezoelectric/Electrostrictive Substance

The step of forming a piezoelectric/electrostrictive substance includes a first forming step and a lamination step. The first forming step includes a raw material preparation substep, a first shaping substep, and a first firing substep. The lamination step includes at least one coating substep and at least one second firing substep. In the first forming step, inorganic particles are applied to the first electrode 22 disposed on the ceramic substrate 12 to form a layer having a thickness of 15 μm or less, which is then fired to grow crystal grains along the surface of the layer. Since a ceramic film is formed by firing the inorganic particle layer having a thickness of 15 μm or less to grow crystal grains, the grain growth is promoted along the surface rather than the thickness direction. Thus, the crystal grains can have a higher aspect ratio while particular crystal faces of the crystal grains are uniformly aligned (oriented). In a perovskite oxide having a general formula of $ABO_3$ in which the A site contains Pb and the B site contains at least two elements selected from Zr, Ti, Nb, Mg, Ni, and Zn, when the composition is controlled to allow the perovskite oxide to grow as an ultrathin film, the perovskite oxide may grow into grains having wavy grain boundaries. In this case, the growth of a (100) plane in a film may facilitate the orientation of the (100) plane in a direction perpendicular to the film. In such an oxide, when grains have faces parallel to the top surface of the inorganic particle layer, other faces (i.e., side faces) of the grains function as growth surfaces that grow horizontally within the inorganic particle layer. Thus, the faces of the grains parallel to the top surface of the inorganic particle layer can be easily expanded, and the grains have a large aspect ratio. The aspect ratio of crystal grains is preferably at least two and more preferably at least three. Crystal grains having an aspect ratio of at least two can be oriented easily. Preferably, the length of each of the crystal grains along the surface of the film is not less than the length of each of the crystal grains in the thickness direction. Such crystal grains are easy to orient. The orientation of crystal faces of an oxide containing Pb, Zr, and Ti is a simple and inexpensive method, as compared with, for example, epitaxial growth on an oriented silicon single crystal by chemical vapor deposition. The orientation of crystal faces of an oxide can increase the degree of orientation without adding an unnecessary element while maintaining the purity of the oxide, as compared with a method for manufacturing a piezoelectric/electrostrictive substance in which an unnecessary element is added to orient crystals. The clause "without adding an unnecessary element", as used herein, is not intended to exclude the use of an additive for increasing the degree of orientation or the mechanical strength without significantly affecting the piezoelectric and electrostrictive characteristics. The aspect ratio of a crystal grain is determined in the following manner. First, the thickness of a crystal grain layer is determined on the basis of SEM observation. The area S of a single crystal grain is calculated by (area of visual field)/(number of crystal grains) in a visual field that includes about 20 to 40 crystal grains. The grain size is calculated by Equation 3 on the assumption that the crystal grain is circular. The grain size is divided by the thickness to calculate the aspect ratio.

[Equation 3]

$$\text{Grain size} = 2\sqrt{S/\pi} \qquad \text{Equation (3)}$$

In the raw material preparation substep, raw materials of the inorganic particles may be pulverized and mixed to prepare the inorganic particles. Preferably, the mixed powder is further calcined and pulverized to prepare the inorganic particles. Preferably, the inorganic particles form an oxide having a perovskite structure. Preferably, the oxide has a general formula of $ABO_3$, in which the A site contains Pb and the B site contains at least one element selected from Zr, Ti, Nb, Mg, Ni, and Zn. The oxide having a general formula of $ABO_3$ may have a composition satisfying Equation 1, in which the value z representing excess M component is in the range of $0.002 \leq z \leq 0.42$. When the M component is contained in an excessive amount, the M component is preferably at least one element selected from Mg, Ni, and Zn and is more preferably an oxide, such as MgO, NiO, or ZnO. In these cases, an excessive amount of M component can easily exert its effects. Preferably, the inorganic particles are pulverized to have a particle size corresponding to the thickness of the inorganic particle layer. Preferably, the median size (D50) of the inorganic particles ranges from 2% to 60% of the thickness of the inorganic particle layer. At a median size of at least 2% of the inorganic particle layer, the inorganic particles can be pulverized easily. At a median size of 60% or less of the inorganic particle layer, the thickness of the inorganic particle layer can be controlled easily. The particle size is measured in a dispersion medium (such as an organic solvent or water) with a laser diffraction/scattering particle size distribution analyzer. Preferably, the inorganic particles are pulverized by wet grinding, for example, by a ball mill, a bead mill, a trommel, or an attritor.

In the first shaping substep, as illustrated in the top in FIG. 4, an inorganic particle layer having a thickness of 15 μm or less is formed on the first electrode 22. For example, an inorganic particle paste is applied to the first electrode 22 by the doctor blade method or screen printing. The paste can be prepared by dispersing inorganic particles in an appropriate dispersion medium. The paste may contain additives, such as a binder and a plasticizer. Preferably, the paste has a viscosity in the range of 50,000 to 500,000 cP. Preferably, the paste is degassed under reduced pressure. The inorganic particle layer has a thickness in the range preferably of 15 μm or less, more preferably of 10 μm or less, still more preferably of 5 μm or less, and still more preferably of 2 μm or less. A thickness of 10 μm or less results in a higher degree of orientation. A thickness of 5 μm or less results in a much higher degree of orientation. Preferably, the thickness of the inorganic particle layer is at least 0.1 μm in terms of ease of application.

In the first firing substep, the inorganic particle layer is fired at a predetermined firing temperature to grow crystals 32 having a particular crystal face oriented in a particular direction and fix the oriented crystals 32 on the first electrode 22. The term "fix", as used herein, means that the piezoelectric/electrostrictive substance 30 is integrated with the ceramic substrate 12 directly or through the first electrode 22 by the reaction with the ceramic substrate 12 or the solid phase reaction with the first electrode 22, without using an organic or inorganic adhesive. Preferably, the particular crystal face is an in-plane pseudo-cubic (100) plane of the piezoelectric/electrostrictive substance. Preferably, the particular direction is parallel to the electric field direction, that is, perpendicular to the surfaces of the first electrode 22 and the second electrode 24. Preferably, the inorganic particle layer is fired at a temperature at least 10% higher than the firing temperature at which crystals in an equilibrium form can be manufactured, for example, the firing temperature at which a bulk is fired for densification and grain growth. At that temperature, crystals in an ultrathin layer can grow sufficiently. Preferably, the firing temperature is as high as possible, provided that the inorganic particles do not decompose. In particular, in a layer having a smaller thickness, because the grain growth is difficult, the firing temperature is preferably increased. For example, a layer of inorganic particles that contain as the main component $Pb(Zr_{1-x}Ti_x)O_3$ and Mg or Nb in the B site is fired at a temperature in the range preferably of 900° C. to 1400° C. and more preferably of 1000° C. to 1350° C. At a firing temperature of 900° C. or more, the crystal growth is promoted. At a firing temperature of 1400° C. or less, the evaporation or decomposition of components of the layer are reduced. Thus, the inorganic particles can grow into crystal grains having an oriented particular crystal face. When the inorganic particle layer contains an organic substance, such as a binder, the layer may be heat-treated mainly for degreasing before firing. The degreasing temperature should be high enough to decompose the organic substance (for example, in the range of 400° C. to 600° C.). Preferably, after degreasing, cold isostatic pressing (CIP) is performed before firing. The CIP can compensate for a decrease in the degree of orientation caused by degreasing, or reduce a decrease in the density of sintered inorganic particles due to the volume expansion of the inorganic particle layer. Preferably, the inorganic particle layer is fired under a condition where a particular component (for example, lead) in the inorganic particle layer is difficult to volatilize (hereinafter referred to as a "reduced volatilization condition"). The low volatilization condition can reduce variations in composition of the inorganic particles due to the volatilization of the particular component in the firing step. Examples of the reduced volatilization include a condition where another inorganic particles coexist and a condition where the inorganic particle layer is hermetically sealed in a lidded container. Preferably, the inorganic particle layer is fired with another material that volatilizes faster than the inorganic particle layer but does not volatilize beyond a predetermined evaporation level in the first firing substep (hereinafter referred to as a "low volatilization condition"). The term "low volatilization condition", as used herein, includes a condition where the inorganic particle layer is fired with a material (for example, inorganic particles) that contains a volatile component in an amount larger than a volatile component in the inorganic particle layer and that has such volatility that does not contaminate the ceramic substrate 12. In particular, when coexisting inorganic particles with which the inorganic particle layer is fired have such a composition that a volatile component (for example, lead) can volatile more easily than the components in the inorganic particle layer, the degree of orientation is improved. Preferably, the coexisting material contains a smaller amount of $Pb(M_x,Nb_y)O_3$ and a larger amount of $PbZrO_3$ than the inorganic particle layer. The coexisting material may contain a larger amount of $PbTiO_3$ than the inorganic particle layer. The coexisting material may contain a smaller amount of excess MO than the inorganic particle layer. It is important to empirically optimize the firing conditions, such as the amount and composition of coexisting inorganic particles, the location of the coexisting inorganic particles in a container, the volume of the container, the installation of the inorganic particle layer, and the amount of the inorganic particle layer. In particular, when the coexisting inorganic particles have a composition of excess volatility, not only the ceramic substrate 12 is contaminated, but also an excess lead component is absorbed into the piezoelectric/electrostrictive substance 30, causing deterioration in performance. Coexisting inorganic particles having excessively low volatility disadvantageously reduce the degree of orientation of the piezoelectric/electrostrictive substance 30. The inorganic particle layer may be fired under pressure, for example, by hot pressing, to promote in-plane grain growth. Through these steps, part of the piezoelectric/electrostrictive substance 30 that contains crystals 32 oriented in a predetermined direction is formed on the first electrode 22 (the second step in FIG. 4).

In the subsequent lamination step, layers of the piezoelectric/electrostrictive substance 30 are repeatedly formed to a desired thickness on the orientation-induced crystallized layer formed in the first forming step. The lamination step may include a single coating substep of applying the inorganic particles on the oriented crystals 32 and a single second firing substep of firing the inorganic particles at a predetermined temperature to grow crystal grains. The lamination step may also include a plurality of coating substeps of applying the inorganic particles on the oriented crystals 32 and a plurality of firing substeps of firing the inorganic particles at a predetermined temperature to grow crystal grains. The number of coating and firing substeps is appropriately determined so that the piezoelectric/electrostrictive substance 30 has a desired thickness, for example, in the range of 1 to 20 μm. The thickness of the inorganic particle layer and firing conditions, such as the firing temperature, may be the same as or different from those in the first forming step. As in the first forming step, degreasing, CIP, firing under the reduced volatilization condition, and firing under the low volatilization condition may be performed. Any of these treatments may be omitted. As illustrated in FIG. 4, in the step of forming a piezoelectric/electrostrictive substance, inorganic particles are applied to the first layer 36a containing the oriented crystals 32 and are fired to form a second layer 36b containing oriented crystals 32 (the third step in FIG. 4). A third layer 36c containing inorganic particles is then formed on the second layer 36b (the fourth step in FIG. 4). These coating and firing substeps are performed repeatedly to give the desired thickness, thus forming the piezoelectric/electrostrictive substance 30 on the first electrode 22 (the fifth step in FIG. 4). In the piezoelectric/electrostrictive substance 30, since crystals grow properly along the surface of each layer, the oriented crystals 32 can be properly oriented in the predetermined direction. The raw material (inorganic particles) in the first forming step (the first layer) and the raw material (inorganic particles) in the subsequent forming step (the second or upper layers) may be the same or different. When inorganic particles contain Pb and oriented crystals 32 having a composition including an excessive amount of M component are grown in the first layer, inorganic particles in the second layer can grow following the oriented crystals 32 in the first layer. Thus, the composition in the second or upper layers may be different from the composition in the first layer; for example, the composition in the second or upper layers does not contain an excessive amount of M component. Preferably, the composition of inorganic particles (raw material) in the second or upper layers is appropriately controlled to provide a desired final composition, considering that an element of the composition may be reduce by firing.

(3) Second Electrode Forming Step

The second electrode 24 is then formed on the piezoelectric/electrostrictive substance 30. In this embodiment, the first electrode 22 and the second electrode 24 are formed on opposite sides of the piezoelectric/electrostrictive substance 30. The second electrode 24 may be formed in the same manner as or in a different way from the first electrode forming step. Thus, the actuator 10 includes the piezoelectric/electrostrictive film element 20 on the ceramic substrate 12. The piezoelectric/electrostrictive film element 20 includes the piezoelectric/electrostrictive substance 30 sandwiched between the second electrode 24 and the first electrode 22, which is disposed on the ceramic substrate 12 (the last step in FIG. 4).

In the piezoelectric/electrostrictive film element 20 according to the present embodiment, the degree of orientation of the piezoelectric/electrostrictive substance 30 can be increased to improve the piezoelectric and electrostrictive characteristics. In addition, since the piezoelectric/electrostrictive substance 30 has particular crystal faces oriented in the electric field direction, the piezoelectric and electrostrictive characteristics can be further improved. Furthermore, since the inorganic particles are fired as a layer, the degree of orientation can be increased by a relatively convenient method, and the piezoelectric/electrostrictive substance 30 can have a high degree of orientation, independently of the orientation of the ceramic substrate 12. Since the inorganic particle layer is fired to form a ceramic film, even a material mainly composed of $Pb(Zr_{1-x}Ti_x)O_3$ can grow into crystal grains having a wavy structure composed of wavy grain boundaries. This increases the degree of orientation. Since a ceramic film having a thickness of about 15 μm can be sequentially layered, a piezoelectric/electrostrictive substance 30 having a thickness of at least about 1 μm (for example, 20 μm) can be manufactured relatively easily. Furthermore, since the degree of orientation is increased layer by layer, the degree of orientation can be properly increased to improve the piezoelectric and electrostrictive characteristics.

The present invention is not limited to the above-mentioned embodiment and can be implemented in various embodiments within the scope of the present invention.

Figure 5:
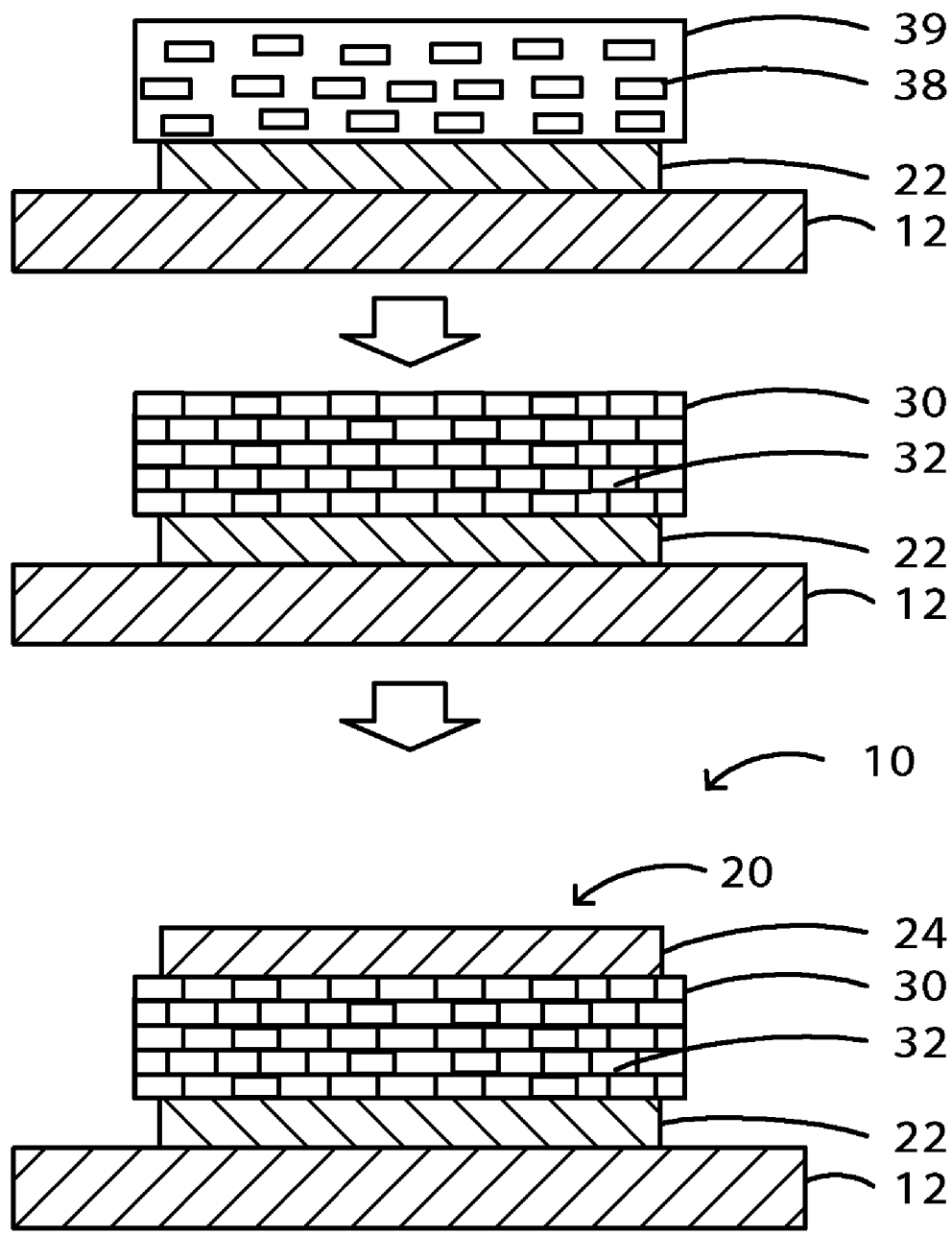
FIG. 5 is an explanatory drawing of a method for manufacturing a piezoelectric/electrostrictive film element 20 according to another embodiment of the present invention.

For example, in the above-mentioned embodiment, the piezoelectric/electrostrictive substance 30 is manufactured by repeatedly performing the coating and firing substeps to orient the crystal faces in a predetermined direction. Alternatively, as illustrated in FIG. 5, a piezoelectric/electrostrictive film element 20 containing oriented crystal grains may be manufactured by preparing a slurry or paste that contains crystal grains of crystallized inorganic particles serving as a template and non-oriented inorganic particles, applying the slurry or paste to a first electrode 22 to the thickness of a piezoelectric/electrostrictive substance 30 while the crystal grains are aligned in a predetermined direction, and firing the slurry or paste. For example, this alternative method may include (1) a first electrode forming step, (2) a step of forming a piezoelectric/electrostrictive substance, which includes a coating substep of applying raw materials containing crystal grains for forming a piezoelectric/electrostrictive substance to a ceramic substrate or to an electrode disposed on the ceramic substrate to form a raw material layer, and a firing substep of firing the raw material layer at a predetermined temperature to grow crystal grains, and (3) a second electrode forming step. FIG. 5 is an explanatory drawing of a method for manufacturing a piezoelectric/electrostrictive film element 20 according to another embodiment of the present invention. From the top, FIG. 5 illustrates a coating substep of a raw material for a piezoelectric/electrostrictive substance 30, an oriented piezoelectric/electrostrictive substance 30 prepared by firing, and a second electrode forming step. The first and second electrode forming steps may be the same as in the above-mentioned embodiment. For convenience of explanation, the step (2) of forming a piezoelectric/electrostrictive substance will be more specifically described. In the coating substep of the step of forming a piezoelectric/electrostrictive substance, a raw material paste is first prepared. The paste contains non-oriented inorganic particles and previously prepared crystal grains 38 having a particular crystal face oriented in a predetermined direction. The crystal grains 38 can be manufactured by preparing a raw material powder (inorganic particles) in a raw material preparation step, the inorganic particles containing such a predetermined excessive amount of M component that the M component becomes excessive after the piezoelectric/electrostrictive substance is formed, forming the inorganic particles into a freestanding sheet having a thickness of 15 μm or less in a shaping step, firing the sheet to form a ceramic sheet composed of grown crystal grains in a firing step, and crushing the fired sheet into pieces having an aspect ratio of more than two, more preferably more than three, in a crushing step. In this case, a mechanism of the orientation of crystal faces is the same as in the formation of the inorganic particle layer on the substrate described above. The term "freestanding sheet", as used herein, refers to a sheet manufactured by firing a sheet-like inorganic particle layer having a thickness of 15 μm or less and excludes a sheet disposed on another sheet and fired, a sheet attached to a substrate and fired, and a sheet formed on a substrate by sputtering, a sol-gel method, an aerosol deposition method, or a printing method. The term "freestanding sheet" includes a sheet that is attached to or formed on a substrate and is removed from the substrate before or after firing. As illustrated in the top in FIG. 5, a coating raw material that contains the crystal grains 38, another raw material powder (for example, non-oriented inorganic particles), and optional additives, such as a binder and a plasticizer, is applied to the first electrode 22, for example, by screen printing or a doctor blade method to form a film 39 in which the crystal grains 38 are aligned unidirectionally. The film 39 has such a thickness that the piezoelectric/electrostrictive substance 30 has a desired thickness. The ceramic substrate 12 and the film 39 are fired at a predetermined temperature to orient that other inorganic particles in the direction of the oriented crystal grains 38, thus forming the piezoelectric/electrostrictive substance 30 (the second step in FIG. 5). This firing step may be performed under the same conditions or in the same manner as in the above-mentioned embodiment. In the second electrode forming step, a second electrode 24 is formed on the piezoelectric/electrostrictive substance 30, thus completing the piezoelectric/electrostrictive film element 20. The present embodiment can also increase the degree of orientation of the piezoelectric/electrostrictive substance 30 to improve the piezoelectric and electrostrictive characteristics. The present embodiment can reduce the number of coating and firing steps, thus providing a simpler process. Reduction in number of firing steps can reduce the energy required for the orientation of crystals.

In the first shaping substep in the step of forming a piezoelectric/electrostrictive substance or the coating substep in the lamination step described above, a raw material for the piezoelectric/electrostrictive substance 30 is applied to the first electrode 22 or layers, such as the first layer 36a, by coating. However, the raw material for the piezoelectric/electrostrictive substance 30 may be formed on the ceramic substrate 12, the first electrode 22, or layers, such as the first layer 36a, by a sol-gel method, chemical vapor deposition, or sputtering. These methods can form a dense inorganic particle layer containing small particles and having small surface roughness. Any of these methods can form a uniform inorganic particle layer, which provides a high withstanding voltage even at a small thickness. The high withstanding voltage prevents dielectric breakdown on the application of a high electric field, allowing for a large bending displacement. With these methods, the coating substep in the lamination step in the above-mentioned embodiment may be a shaping substep.

While the actuator 10 that discharges liquid is described in the above-mentioned embodiment, any device utilizing the piezoelectric and electrostrictive characteristics can be used in the present invention. For example, the piezoelectric/electrostrictive film element 20 can be utilized in polycrystalline materials formed of a substance whose function or characteristics depend on the crystal orientation, such as dielectric materials, pyroelectric materials, ferroelectric materials, magnetic materials, ion conducting materials, electron conducting materials, heat conducting materials, thermoelectric materials, superconducting materials, and abrasion resistant materials. More specifically, the piezoelectric/electrostrictive film element 20 can provide high-performance devices, for example, sensors such as acceleration sensors, pyroelectric sensors, ultrasonic sensors, electric field sensors, temperature sensors, gas sensors, knocking sensors, yaw rate sensors, airbag sensors, and piezoelectric gyro-sensors, energy conversion elements, such as piezoelectric transducers, low-loss actuators and low-loss resonators, such as ultrasonic motors and resonators, capacitors, bimorph piezoelectric elements, vibration pickups, piezoelectric microphones, piezoelectric ignition devices, sonar, piezoelectric buzzers, piezoelectric speakers, radiators, filters, dielectric elements, microwave dielectric devices, thermoelectric transducers, pyroelectric elements, magnetoresistive elements, magnetic elements, superconducting devices, resistance elements, electron conducting elements, ion conducting elements, PTC elements, and NTC elements. The thickness and the degree of orientation of the piezoelectric/electrostrictive substance 30 are appropriately determined for a specific use.

In the above-mentioned embodiment, while the ceramic substrate 12 has a single opening 14, the ceramic substrate 12 may have a plurality of openings 14 and piezoelectric/electrostrictive substances 30. Alternatively, the ceramic substrate 12 may have no opening.

Figure 6:
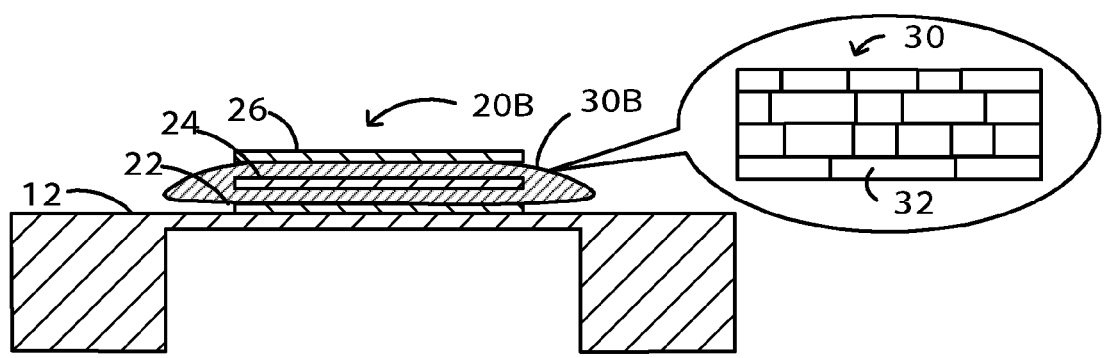
FIG. 6 is an explanatory drawing of another piezoelectric/electrostrictive film element 20B.

In the above-mentioned embodiments, while the piezoelectric/electrostrictive substance 30 has a rectangular plate shape, the piezoelectric/electrostrictive substance 30 may have any shape. Likewise, the first electrode 22, the second electrode 24, and the ceramic substrate 12 may have any shape. For example, as illustrated in FIG. 6, a piezoelectric/electrostrictive film element 20B includes a dome-shaped piezoelectric/electrostrictive substance 30B and a plurality of electrodes 22, 24, and 26; that is, the first electrode 22 on the undersurface of the piezoelectric/electrostrictive substance 30B, the second electrode 24 inside the piezoelectric/electrostrictive substance 30B, and the third electrode 26 on the top of the piezoelectric/electrostrictive substance 30B.

In the above-mentioned embodiments, while the piezoelectric/electrostrictive substance 30 is formed on the first electrode 22 disposed on the ceramic substrate 12, the piezoelectric/electrostrictive substance 30 may be directly formed on the ceramic substrate 12. Such a structure can also increase the degree of orientation of the piezoelectric/electrostrictive substance 30 to improve the piezoelectric and electrostrictive characteristics.

EXAMPLES

Actual manufacture of a piezoelectric/electrostrictive film element will be described below as experimental examples.

Experimental Example 1

Raw Material Preparation Substep

A synthetic powder that was to provide a piezoelectric/electrostrictive substance having a composition of $0.2\text{Pb}(\text{Mg}_{0.33}\text{Nb}_{0.67})\text{O}_3+0.35\text{PbTiO}_3+0.45\text{PbZrO}_3$ (also referred to as basic composition 1) containing 0.002 mol MgO, zirconia balls, and ion-exchanged water, which was a dispersion medium, were charged in a polypot and were wet-blended in a ball mill for 16 hours. The resulting slurry was dried in a dryer and was calcined at 1000° C. for two hours. The calcined powder, zirconia balls, and ion-exchanged water, which was a dispersion medium, were wet-grinded in a ball mill for 16 hours and were dried in a dryer to produce a powder of first inorganic particles. The median size (D50) of the powder was 0.4 μm, as determined in a dispersion medium of water with a laser scattering particle size distribution analyzer LA-750 manufactured by HORIBA Ltd. A synthetic powder that was to provide a piezoelectric/electrostrictive substance having a composition of $0.2\text{Pb}(\text{Mg}_{0.33}\text{Nb}_{0.67})\text{O}_3+0.35\text{PbTiO}_3+0.45\text{PbZrO}_3$ containing 0.02 mol NiO, zirconia balls, and ion-exchanged water, which was a dispersion medium, were charged in a polypot and were wet-blended in a ball mill for 16 hours. The resulting slurry was dried in a dryer and was calcined at 1000° C. for two hours. The calcined powder, zirconia balls, and ion-exchanged water, which was a dispersion medium, were wet-grinded in a ball mill for 16 hours and were dried in a dryer to produce a powder of second inorganic particles.

First Electrode Forming Step

A first electrode formed of Pt (1.2×0.8 mm in size and 3 μm in thickness) was formed on an $Y_2O_3$-stabilized $ZrO_2$ substrate having a flat thin-walled portion (thin-walled portion:

1.6×1.1 mm in size and 7 μm in thickness) by screen printing and was heat-treated at 1300° C. for two hours to be integrated with the substrate.

Step of Forming Piezoelectric/Electrostrictive Substance

A first forming step was performed; that is, a paste that contained a composition of $0.2Pb(Mg_{0.33}Nb_{0.67})O_3+0.35PbTiO_3+0.45PbZrO_3$ containing 0.002 mol MgO, a dispersion medium, a plasticizer, and a dispersing agent was applied to the first electrode by screen printing to form a film having a size of 1.3 mm×0.9 mm and a thickness of 2 μm as measured after drying. The film in a magnesia container (90 mm square, 50 mm in height) was heat-treated (fired) at 1280° C. for three hours under a low volatilization condition in the presence of 20 g of powder (coexisting material) having a composition of $0.12Pb(Mg_{0.33}Nb_{0.67})O_3+0.38PbTiO_3+0.50PbZrO_3$ containing 0.02 mol NiO (also referred to as firing atmosphere A). The resulting ceramic film (piezoelectric/electrostrictive substance) had a thickness of 1.3 μm and a degree of orientation of 20% as determined by the Lotgering method. The determination of the degree of orientation will be described below. A lamination step that included a single coating substep and a single second firing substep was then performed. More specifically, in the coating substep, a paste that contained a composition of second inorganic particles, a dispersion medium, a plasticizer, and a dispersing agent was applied to the ceramic film by screen printing to form a inorganic particle layer having a size of 1.3 mm×0.9 mm and a thickness of 8 μm as measured after drying. In the second firing substep, the inorganic particle layer was heat treated (fired) at 1280° C. for three hours. In the second firing substep, firing was performed in the presence of the same coexisting material as in the first firing substep. The resulting ceramic film (piezoelectric/electrostrictive substance) had a thickness of 5.1 μm and a degree of orientation of 18% as determined by the Lotgering method.

Second Electrode Forming Step

A second electrode formed of Au (1.2 mm×0.8 mm in size and 0.5 μm in thickness) was formed on the piezoelectric/electrostrictive substance by screen printing. After heat treatment, a piezoelectric film actuator including a piezoelectric drive film according to Experimental Example 1 was obtained. Table 1 summarizes a basic composition having a general formula of $ABO_3$ in the equation of $\{a \times Pb(M'_x, Nb_y)O_3 + b \times PbZrO_3 + c \times PbTiO_3\} + zM''O$ ($a+b+c=1$, $x+y=1$, and M' denotes at least one element selected from Mg, Ni and Zn and M'' denotes at least one element selected from Mg, Ni and Zn) excluding an additive component (zMO) and the composition of the coexisting material. Table 1 also shows the basic compositions and the compositions of coexisting materials in Experimental Examples 2 to 25 described below.

TABLE 1

| | Basic composition | Composition of coexisting material |
|---|---|---|
| Experimental Example 1 | 1) $0.2Pb(Mg_{1/3}Nb_{2/3})O_3 + 0.35PbTiO_3 + 0.45PbZrO_3$ | A) $0.12Pb(Mg_{1/3}Nb_{2/3})O_3 + 0.38PbTiO_3 + 0.50PbZrO_3 + 0.02$ mol % NiO |
| Experimental Example 2 | $0.2Pb(Mg_{1/3}Nb_{2/3})O_3 + 0.35PbTiO_3 + 0.45PbZrO_3$ | $0.12Pb(Mg_{1/3}Nb_{2/3})O_3 + 0.38PbTiO_3 + 0.50PbZrO_3 + 0.02$ mol % NiO |
| Experimental Example 3 | $0.2Pb(Mg_{1/3}Nb_{2/3})O_3 + 0.35PbTiO_3 + 0.45PbZrO_3$ | $0.12Pb(Mg_{1/3}Nb_{2/3})O_3 + 0.38PbTiO_3 + 0.50PbZrO_3 + 0.02$ mol % NiO |
| Experimental Example 4 | $0.2Pb(Mg_{1/3}Nb_{2/3})O_3 + 0.35PbTiO_3 + 0.45PbZrO_3$ | $0.12Pb(Mg_{1/3}Nb_{2/3})O_3 + 0.38PbTiO_3 + 0.50PbZrO_3 + 0.02$ mol % NiO |
| Experimental Example 5 | $0.2Pb(Mg_{1/3}Nb_{2/3})O_3 + 0.35PbTiO_3 + 0.45PbZrO_3$ | $0.12Pb(Mg_{1/3}Nb_{2/3})O_3 + 0.38PbTiO_3 + 0.50PbZrO_3 + 0.02$ mol % NiO |
| Experimental Example 6 | $0.2Pb(Mg_{1/3}Nb_{2/3})O_3 + 0.35PbTiO_3 + 0.45PbZrO_3$ | $0.12Pb(Mg_{1/3}Nb_{2/3})O_3 + 0.38PbTiO_3 + 0.50PbZrO_3 + 0.02$ mol % NiO |
| Experimental Example 7 | $0.2Pb(Mg_{1/3}Nb_{2/3})O_3 + 0.35PbTiO_3 + 0.45PbZrO_3$ | $0.12Pb(Mg_{1/3}Nb_{2/3})O_3 + 0.38PbTiO_3 + 0.50PbZrO_3 + 0.02$ mol % NiO |
| Experimental Example 8 | $0.2Pb(Mg_{1/3}Nb_{2/3})O_3 + 0.35PbTiO_3 + 0.45PbZrO_3$ | $0.12Pb(Mg_{1/3}Nb_{2/3})O_3 + 0.38PbTiO_3 + 0.50PbZrO_3 + 0.02$ mol % NiO |
| Experimental Example 9 | $0.2Pb(Mg_{1/3}Nb_{2/3})O_3 + 0.35PbTiO_3 + 0.45PbZrO_3$ | $0.12Pb(Mg_{1/3}Nb_{2/3})O_3 + 0.38PbTiO_3 + 0.50PbZrO_3 + 0.02$ mol % NiO |
| Experimental Example 10 | $0.2Pb(Mg_{1/3}Nb_{2/3})O_3 + 0.35PbTiO_3 + 0.45PbZrO_3$ | B) $0.2Pb(Mg_{1/3}Nb_{2/3})O_3 + 0.35PbTiO_3 + 0.45PbZrO_3 + 0.02$ mol % NiO |
| Experimental Example 11 | $0.2Pb(Mg_{1/3}Nb_{2/3})O_3 + 0.35PbTiO_3 + 0.45PbZrO_3$ | C) $0.2Pb(Mg_{1/3}Nb_{2/3})O_3 + 0.35PbTiO_3 + 0.45PbZrO_3 + 0.02$ mol % NiO + 0.08 mol % MgO |
| Experimental Example 12 | 2) $0.2Pb(Mg_{1/3}Nb_{2/3})O_3 + 0.43PbTiO_3 + 0.37PbZrO_3$ | D) $0.12Pb(Mg_{1/3}Nb_{2/3})O_3 + 0.43PbTiO_3 + 0.45PbZrO_3 + 0.02$ mol % NiO |
| Experimental Example 13 | $0.2Pb(Mg_{1/3}Nb_{2/3})O_3 + 0.43PbTiO_3 + 0.37PbZrO_3$ | $0.12Pb(Mg_{1/3}Nb_{2/3})O_3 + 0.43PbTiO_3 + 0.45PbZrO_3 + 0.02$ mol % NiO |
| Experimental Example 14 | $0.2Pb(Mg_{1/3}Nb_{2/3})O_3 + 0.43PbTiO_3 + 0.37PbZrO_3$ | $0.12Pb(Mg_{1/3}Nb_{2/3})O_3 + 0.43PbTiO_3 + 0.45PbZrO_3 + 0.02$ mol % NiO |
| Experimental Example 15 | $0.2Pb(Mg_{1/3}Nb_{2/3})O_3 + 0.43PbTiO_3 + 0.37PbZrO_3$ | $0.12Pb(Mg_{1/3}Nb_{2/3})O_3 + 0.43PbTiO_3 + 0.45PbZrO_3 + 0.02$ mol % NiO |
| Experimental Example 16 | $0.2Pb(Mg_{1/3}Nb_{2/3})O_3 + 0.43PbTiO_3 + 0.37PbZrO_3$ | $0.12Pb(Mg_{1/3}Nb_{2/3})O_3 + 0.43PbTiO_3 + 0.45PbZrO_3 + 0.02$ mol % NiO |
| Experimental Example 17 | $0.2Pb(Mg_{1/3}Nb_{2/3})O_3 + 0.43PbTiO_3 + 0.37PbZrO_3$ | $0.12Pb(Mg_{1/3}Nb_{2/3})O_3 + 0.43PbTiO_3 + 0.45PbZrO_3 + 0.02$ mol % NiO |
| Experimental Example 18 | $0.2Pb(Mg_{1/3}Nb_{2/3})O_3 + 0.43PbTiO_3 + 0.37PbZrO_3$ | $0.12Pb(Mg_{1/3}Nb_{2/3})O_3 + 0.43PbTiO_3 + 0.0 0.45PbZrO_3 + 0.02$ mol % NiO |
| Experimental Example 19 | $0.2Pb(Mg_{1/3}Nb_{2/3})O_3 + 0.43PbTiO_3 + 0.37PbZrO_3$ | $0.12Pb(Mg_{1/3}Nb_{2/3})O_3 + 0.43PbTiO_3 + 0.45PbZrO_3 + 0.02$ mol % NiO |
| Experimental Example 20 | $0.2Pb(Mg_{1/3}Nb_{2/3})O_3 + 0.43PbTiO_3 + 0.37PbZrO_3$ | $0.12Pb(Mg_{1/3}Nb_{2/3})O_3 + 0.43PbTiO_3 + 0.45PbZrO_3 + 0.02$ mol % NiO |
| Experimental Example 21 | $0.2Pb(Mg_{1/3}Nb_{2/3})O_3 + 0.43PbTiO_3 + 0.37PbZrO_3$ | E) $0.2Pb(Mg_{1/3}Nb_{2/3})O_3 + 0.43PbTiO_3 + 0.37PbZrO_3 + 0.02$ mol % NiO |
| Experimental Example 22 | $0.2Pb(Mg_{1/3}Nb_{2/3})O_3 + 0.43PbTiO_3 + 0.37PbZrO_3$ | F) $0.2Pb(Mg_{1/3}Nb_{2/3})O_3 + 0.43PbTiO_3 + 0.37PbZrO_3 + 0.02$ mol % NiO + 0.08 mol % MgO |

TABLE 1-continued

| | Basic composition | Composition of coexisting material |
|---|---|---|
| Experimental Example 23 | 0.2Pb(Mg$_{1/3}$Nb$_{2/3}$)O$_3$ + 0.43PbTiO$_3$ + 0.37PbZrO$_3$ | D) 0.12Pb(Mg$_{1/3}$Nb$_{2/3}$)O$_3$ + 0.43PbTiO$_3$ + 0.45PbZrO$_3$ + 0.02 mol % NiO |
| Experimental Example 24 | 3) 0.25Pb(Ni$_{1/3}$Nb$_{2/3}$)O$_3$ + 0.40PbTiO$_3$ + 0.35PbZrO$_3$ | G) 0.18Pb(Ni$_{1/3}$Nb$_{2/3}$)O$_3$ + 0.40PbTiO$_3$ + 0.42PbZrO$_3$ |
| Experimental Example 25 | 4) 0.15Pb(Zn$_{1/3}$Nb$_{2/3}$)O$_3$ + 0.425PbTiO$_3$ + 0.425PbZrO$_3$ | H) 0.12Pb(Zn$_{1/3}$Nb$_{2/3}$)O$_3$ + 0.38PbTiO$_3$ + 0.50PbZrO$_3$ |

Experimental Examples 2 to 9

A piezoelectric film actuator according to Experimental Example 2 was manufactured in the same manner as Experimental Example 1, except that an additive component of mol NiO substituted for the additive component of mol MgO in the composition of the piezoelectric/electrostrictive substance in Experimental Example 1 (0.2Pb(Mg$_{0.33}$Nb$_{0.67}$)O$_3$+0.35PbTiO$_3$+0.45PbZrO$_3$+0.002 mol MgO). A piezoelectric film actuator according to Experimental Example 3 was manufactured in the same manner as Experimental Example 1, except that 0.01 mol MgO and 0.02 mol NiO (0.030 mol in total) were used as additive components. A piezoelectric film actuator according to Experimental Example 4 was manufactured in the same manner as Experimental Example 1, except that 0.04 mol MgO and 0.02 mol NiO (0.060 mol in total) were used as additive components. A piezoelectric film actuator according to Experimental Example 5 was manufactured in the same manner as Experimental Example 1, except that 0.08 mol MgO and 0.02 mol NiO (0.100 mol in total) were used as additive components. A piezoelectric film actuator according to Experimental Example 6 was manufactured in the same manner as Experimental Example 1, except that 0.4 mol MgO and 0.02 mol NiO (0.42 mol in total) were used as additive components. A piezoelectric film actuator according to Experimental Example 7 was manufactured in the same manner as Experimental Example 1, except that 1 mol MgO and 0.02 mol NiO (1.020 mol in total) were used as additive components. A piezoelectric film actuator according to Experimental Example 8 was manufactured in the same manner as Experimental Example 1, except that 0 mol MgO and 0.06 mol NiO (0.060 mol in total) were used as additive components. A piezoelectric film actuator according to Experimental Example 9 was manufactured in the same manner as Experimental Example 1, except that 0 mol MgO, 0.02 mol NiO, and 0.04 mol ZnO (0.060 mol in total) were used as additive components. The median sizes (D50s) of inorganic particles in the raw material preparation substep in Experimental Examples 2 to 9 were about 0.4 μm. The median sizes (D50s) of inorganic particles in the raw material preparation substep in Experimental Examples 10 to 25 described below were also about 0.4 μm.

Experimental Examples 10 and 11

In the raw material preparation substep, 0.2Pb(Mg$_{0.33}$Nb$_{0.67}$)O$_3$+0.35PbTiO$_3$+0.45PbZrO$_3$ (basic composition 1) and 0.02 mol NiO were blended to prepare a raw material. In the firing substep, firing was performed in the presence of 20 g of powder having a composition of 0.2Pb(Mg$_{0.33}$Nb$_{0.67}$)O$_3$+0.35PbTiO$_3$+0.45PbZrO$_3$ containing 0.02 mol NiO (also referred to as firing atmosphere B). Except those, a piezoelectric film actuator according to Experimental Example 10 was manufactured in the same manner as Experimental Example 1. Alternatively, in the raw material preparation substep, 0.2Pb(Mg$_{0.33}$Nb$_{0.67}$)O$_3$+0.35PbTiO$_3$+0.45PbZrO$_3$ (basic composition 1), 0.08 mol MgO, and 0.02 mol NiO were blended to prepare a raw material. In the firing substep, firing was performed in the presence of 20 g of powder having a composition of 0.2Pb(Mg$_{0.33}$Nb$_{0.67}$)O$_3$+0.35PbTiO$_3$+0.45PbZrO$_3$ containing 0.02 mol NiO and 0.08 mol MgO (firing atmosphere C). Except those, a piezoelectric film actuator according to Experimental Example 11 was manufactured in the same manner as Experimental Example 1.

Experimental Examples 12 to 20

In the raw material preparation substep, 0.2Pb(Mg$_{0.33}$Nb$_{0.67}$)O$_3$+0.43PbTiO$_3$+0.37PbZrO$_3$ (basic composition 2) and 0.002 mol NiO were blended to prepare a raw material. In the firing substep, firing was performed in the presence of 20 g of powder having a composition of 0.12Pb(Mg$_{0.33}$Nb$_{0.67}$)O$_3$+0.43PbTiO$_3$+0.45PbZrO$_3$ containing 0.02 mol NiO (firing atmosphere D). Except those, a piezoelectric film actuator according to Experimental Example 12 was manufactured in the same manner as Experimental Example 1. A piezoelectric film actuator according to Experimental Example 13 was manufactured in the same manner as Experimental Example 12, except that 0.02 mol NiO (0.02 mol in total) was used as an additive component. A piezoelectric film actuator according to Experimental Example 14 was manufactured in the same manner as Experimental Example 12, except that 0.01 mol MgO and 0.02 mol NiO (0.030 mol in total) were used as additive components. A piezoelectric film actuator according to Experimental Example 15 was manufactured in the same manner as Experimental Example 12, except that 0.04 mol MgO and 0.02 mol NiO (0.060 mol in total) were used as additive components. A piezoelectric film actuator according to Experimental Example 16 was manufactured in the same manner as Experimental Example 12, except that 0.08 mol MgO and 0.02 mol NiO (0.100 mol in total) were used as additive components. A piezoelectric film actuator according to Experimental Example 17 was manufactured in the same manner as Experimental Example 12, except that 0.4 mol MgO and 0.02 mol NiO (0.42 mol in total) were used as additive components. A piezoelectric film actuator according to Experimental Example 18 was manufactured in the same manner as Experimental Example 12, except that 1 mol MgO and 0.02 mol NiO (1.020 mol in total) were used as additive components. A piezoelectric film actuator according to Experimental Example 19 was manufactured in the same manner as Experimental Example 12, except that 0 mol MgO and 0.06 mol NiO (0.060 mol in total) were used as additive components. A piezoelectric film actuator according to Experimental Example 20 was manufactured in the same manner as Experimental Example 12, except that 0 mol MgO, 0.02 mol NiO, and 0.04 mol ZnO (0.060 mol in total) were used as additive components.

Experimental Examples 21 and 22

In the raw material preparation substep, 0.2Pb(Mg$_{0.33}$Nb$_{0.67}$)O$_3$+0.43PbTiO$_3$+0.37PbZrO$_3$ (basic composition 2) and 0.02 mol NiO were blended to prepare a raw material. In the firing substep, firing was performed in the presence of 20 g of powder having a composition of 0.2Pb$(Mg_{0.33}Nb_{0.67})O_3+0.43PbTiO_3+0.37PbZrO_3$ containing 0.02 mol NiO (firing atmosphere E). Except those, a piezoelectric film actuator according to Experimental Example 21 was manufactured in the same manner as Experimental Example 1. Alternatively, in the raw material preparation substep, 0.2Pb$(Mg_{0.33}Nb_{0.67})O_3+0.43PbTiO_3+0.37PbZrO_3$ (basic composition 2), 0.08 mol MgO, and 0.02 mol NiO were blended to prepare a raw material. Alternatively, in the firing substep, firing was performed in the presence of 20 g of powder having a composition of 0.2Pb$(Mg_{0.33}Nb_{0.67})O_3$+ $0.43PbTiO_3+0.37PbZrO_3$ containing 0.08 mol MgO and 0.02 mol NiO (firing atmosphere F). Except those, a piezoelectric film actuator according to Experimental Example 22 was manufactured in the same manner as Experimental Example 1.

Experimental Examples 23 to 25

In the raw material preparation substep, 0.2Pb$(Mg_{0.33}Nb_{0.67})O_3+0.43PbTiO_3+0.37PbZrO_3$ (basic composition 2) and 0.08 mol MgO were blended to prepare a raw material. In the firing substep, firing was performed in the presence of 20 g of powder having a composition of 0.12Pb$(Mg_{0.33}Nb_{0.67})O_3+0.43PbTiO_3+0.45PbZrO_3$ containing 0.02 mol NiO (firing atmosphere D). Except those, a piezoelectric film actuator according to Experimental Example 23 was manufactured in the same manner as Experimental Example 1. In the raw material preparation substep, 0.25Pb$(Ni_{3.33}Nb_{0.67})O_3+0.40PbTiO_3+0.35PbZrO_3$ (basic composition 3) and 0.06 mol NiO were blended to prepare a raw material. In the firing substep, firing was performed in the presence of 20 g of powder having a composition of 0.18Pb$(Ni_{0.33}Nb_{0.67})O_3+0.40PbTiO_3+0.42PbZrO_3$ (firing atmosphere G). Except those, a piezoelectric film actuator according to Experimental Example 24 was manufactured in the same manner as Experimental Example 1. Alternatively, in the raw material preparation substep, 0.15Pb$(Zn_{0.33}Nb_{0.67})$ $O_3+0.425PbTiO_3+0.425PbZrO_3$ (basic composition 4) and 0.04 mol ZnO were blended to prepare a raw material. In the firing substep, firing was performed in the presence of 20 g of powder having a composition of 0.12Pb$(Zn_{0.33}Nb_{0.67})O_3$+ $0.38PbTiO_3+0.50PbZrO_3$ (firing atmosphere H). Except those, a piezoelectric film actuator according to Experimental Example 25 was manufactured in the same manner as Experimental Example 1.

X-ray Diffraction Measurement and Calculation of Degree of Orientation

The X-ray diffraction pattern of crystal faces of a ceramic film (piezoelectric/electrostrictive substance) was measured for Experimental Examples 1 to 25 with an X-ray diffractometer (RINT TTRIII, manufactured by Rigaku Co.). From this X-ray diffraction pattern, the degree of orientation of the pseudo-cubic (100) plane was calculated according to Equation 2 by the Lotgering method using peaks of pseudo-cubic (100), (110), and (111).

Electron Photomicrography and Elementary Analysis

SEM photographs of crystal grains grown in a first layer formed on the first electrode in the first forming step in Experimental Examples 1 to 25 were taken with a scanning electron microscope (JSM-6390, manufactured by JEOL Ltd.) (see FIGS. 7 to 9). The surface or cross section of piezoelectric/electrostrictive substance in the first layer was observed with the scanning electron microscope by electron probe microanalysis (JXA-8800, manufactured by JEOL Ltd.) to identify elements and the final composition.

Calculation of Curvature

The curvature was determined for Experimental Examples 1 to 25 from electron micrographs in the following manner. First, on the basis of a SEM photograph of crystal grains taken in a visual field that included 20 to 40 crystal grains, the maximum lengths of crystal faces of all the crystal grains that were entirely included in the visual field (i.e., excluding grain fragments cut at the edge of the visual field) were measured as the grain sizes. The grain sizes were averaged. Five grains having a size larger than the average grain size were arbitrarily selected. In the selected grains, a first straight line was drawn between two triple points of adjacent grain boundaries. A second straight line parallel to the first straight line and in contact with the grain boundary between the two triple points was drawn. The length of the perpendicular line from the contact point to the first straight line was measured. The ratio of the length of the perpendicular line to the length of the first straight line was calculated for all the grain boundaries of a selected grain. The maximum ratio was taken as the curvature of the crystal grain. The mean value of the curvatures of the five selected crystal grains was considered as the curvature of a piezoelectric/electrostrictive substance.

Bending Displacement

A voltage was applied between electrodes of a piezoelectric/electrostrictive film actuator 10 manufactured in Experimental Examples 1 to 25 to generate an electric field of 3 kV/mm. The resulting bending displacement (am) was measured with a laser Doppler vibrometer (sensor AT0022 and demodulator AT3500, both manufactured by Graphtec Co.).

Evaluation of Insulation Performance

An electric field of 20 kV/mm was applied between electrodes of a piezoelectric/electrostrictive film actuator 10 manufactured in Experimental Examples 1 to 25. The number of shorts per 100 actuators was measured.

Measurements

Figure 7:
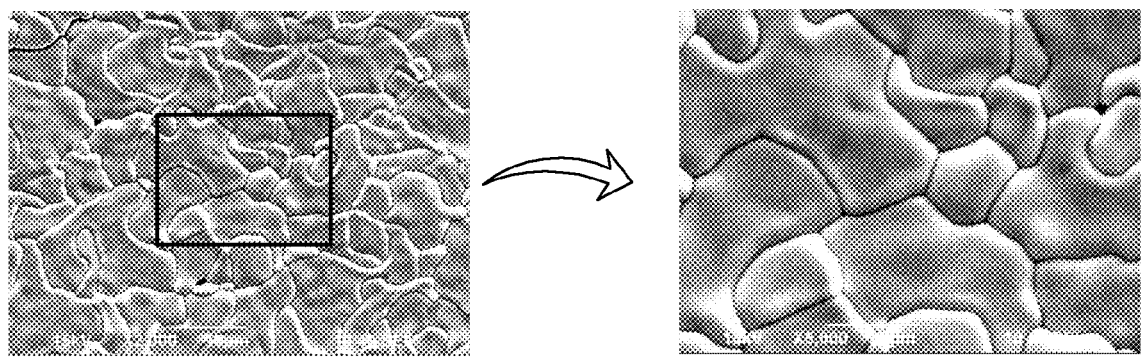
FIG. 7 is a scanning electron microscope (SEM) photograph of crystal grains prepared in Experimental Example 5.
Figure 8:
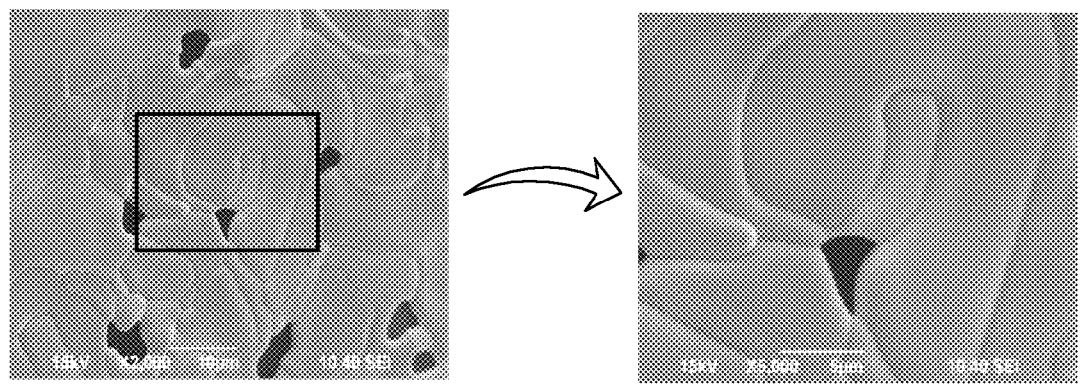
FIG. 8 is a SEM photograph of crystal grains prepared in Experimental Example 8.
Figure 9:
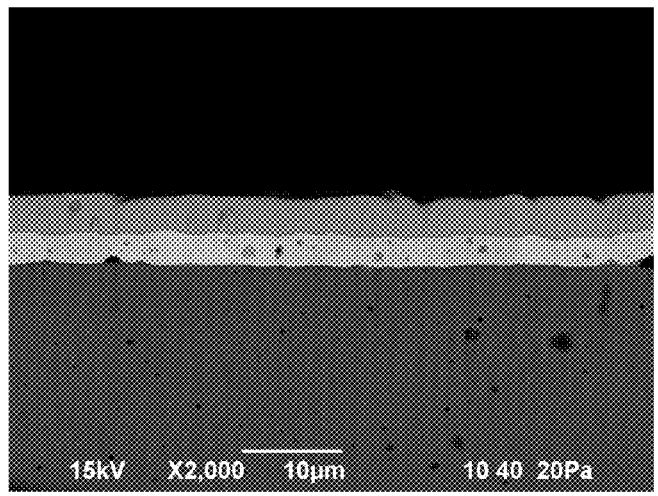
FIG. 9 shows SEM photographs of crystal grains prepared in Experimental Example 4.
Figure 9:
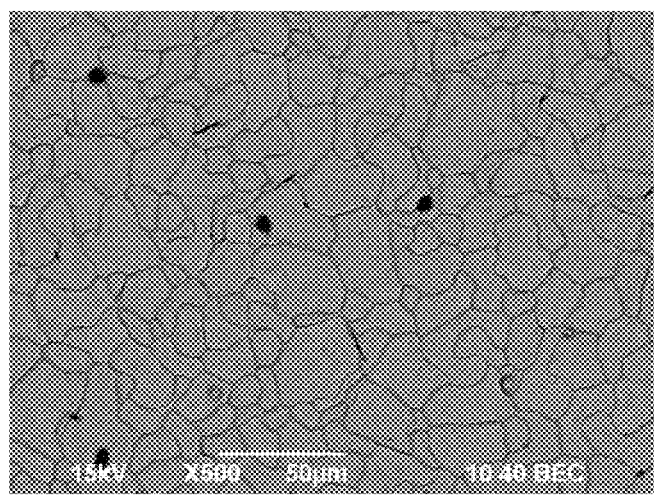
Figure 9:
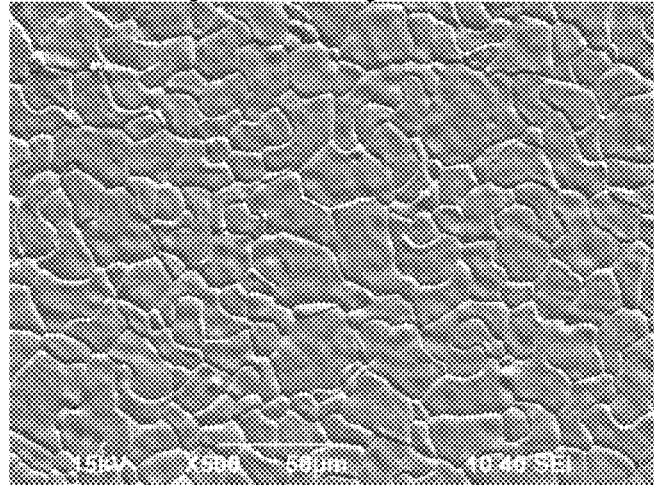
Figure 10:
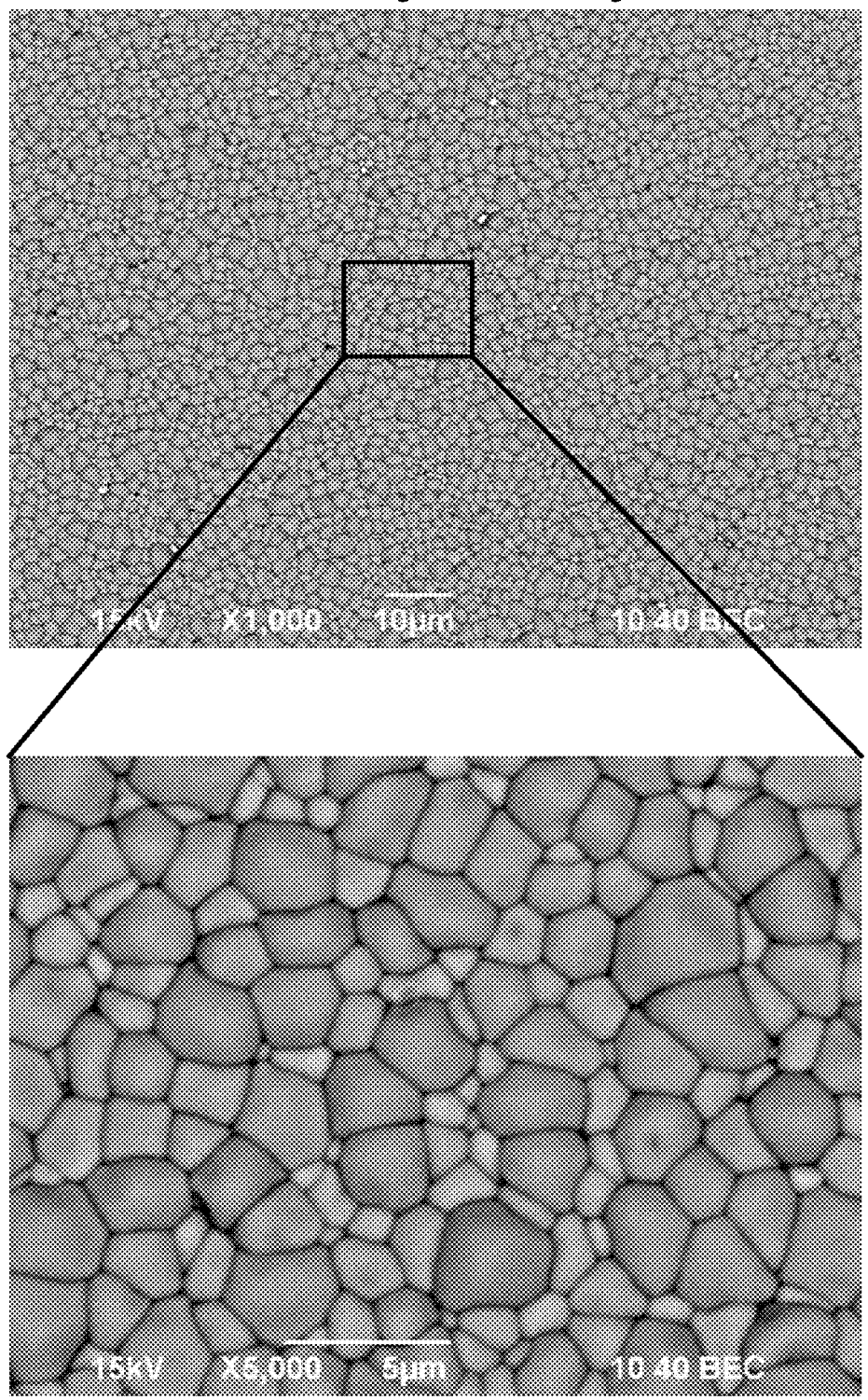
FIG. 10 is a SEM photograph of crystal grains prepared in Experimental Example 10.
Figure 11:
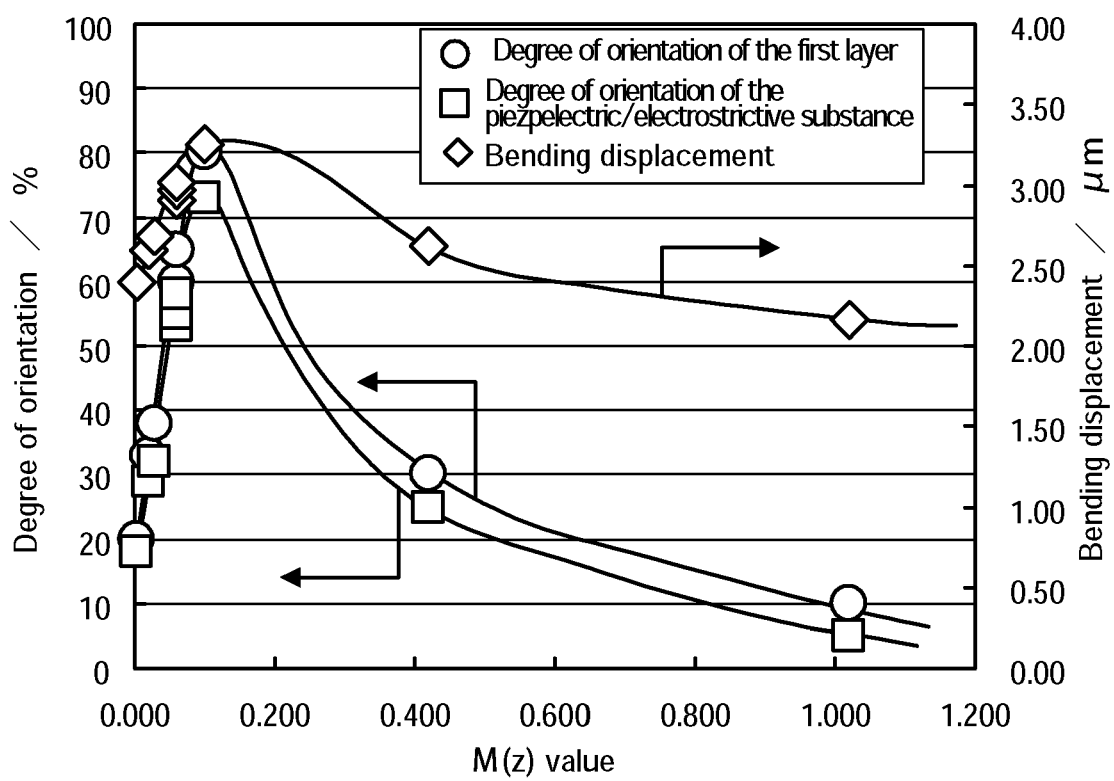
FIG. 11 is a graph illustrating the degree of orientation as determined by the Lotgering method and bending displacement as a function of proportion z of Mg, Ni, and Zn in Experimental Examples 1 to 10.
Figure 12:
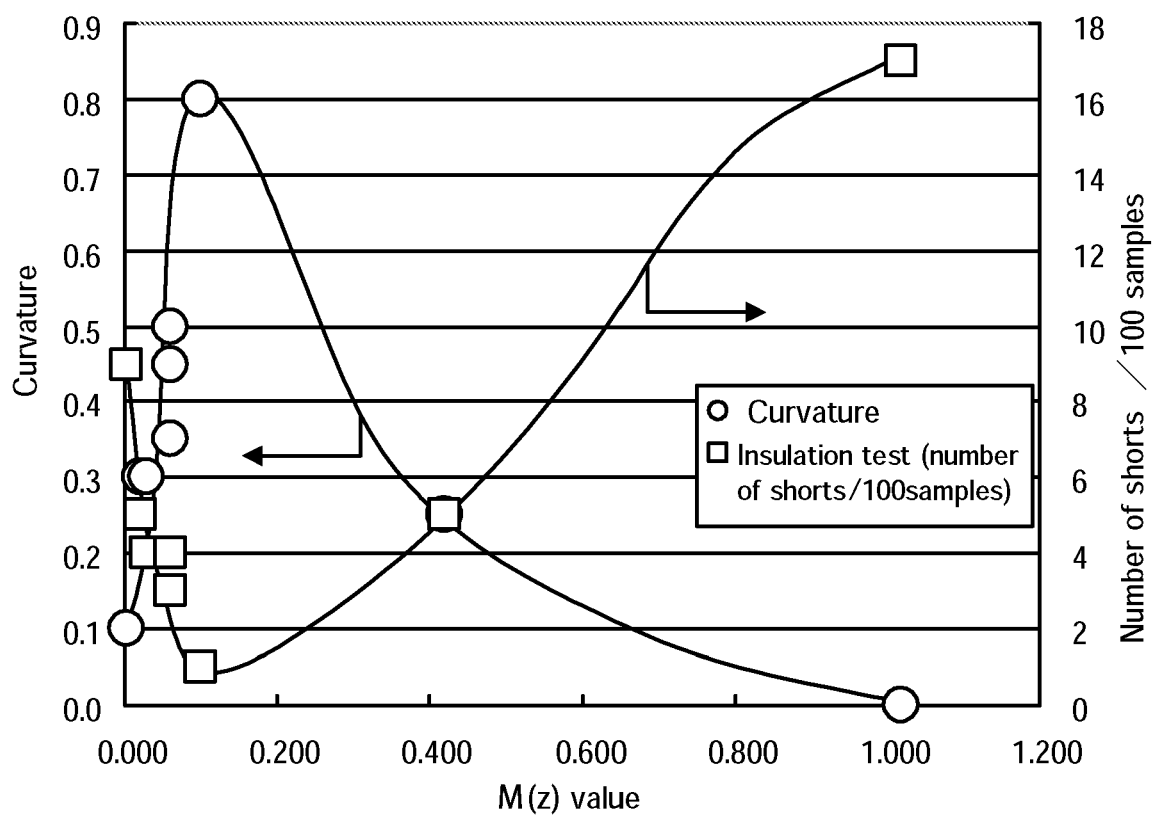
FIG. 12 is a graph illustrating the curvature and the number of shorts per 100 samples in an insulation test as a function of proportion z of Mg, Ni, and Zn in Experimental Examples 1 to 10.

Table 2 summarizes the basic composition, the type and amount of M component in Equation 1, the firing atmosphere, the curvature, the degrees of orientation of the first layer and the piezoelectric/electrostrictive substance as determined by the Lotgering method, the bending displacement, and the insulation test results. In the firing atmospheres A, D, G, and H, an inorganic particle layer was fired in the presence of a coexisting material having a composition different from the composition of the inorganic particle layer (predetermined low volatilization condition). In the firing atmospheres B, C, E, and F, an inorganic particle layer was fired in the presence of a coexisting material having the same composition as the inorganic particle layer. FIG. 7 is a SEM photograph of crystal grains prepared in Experimental Example 5. FIG. 8 is a SEM photograph of crystal grains prepared in Experimental Example 8. FIG. 9 shows SEM photographs (a SEM image of a chemically polished cross section, a backscattered electron image of a surface, and a secondary electron image of the surface) of crystal grains prepared in Experimental Example 4. FIG. 10 is a SEM photograph of common crystal grains prepared in Experimental Example 10. FIG. 11 is a graph illustrating the degree of orientation as determined by the Lotgering method and bending displacement as a function of proportion (z in Equation 1) of Mg, Ni, and Zn in Experimental Examples 1 to 10. FIG. 12 is a graph illustrating the curvature and the number of shorts per 100 samples in the insulation test as a function of proportion (z in Equation 1) of Mg, Ni, and Zn in Experimental Examples 1 to 10. As shown in FIGS. 7 to 10, in Experimental Examples 4, 5 and 8, the first layer of the piezoelectric/electrostrictive substance on the first electrode contains a plurality of crystal grains that have a wavy structure composed of wavy grain boundaries in cross section. The wavy grain boundaries included concave portions and convex portions. The concave portions and the convex portions mated with convex portions and concave portions of adjacent crystal grains, respectively. The crystal grains formed a plate having a high aspect ratio. The piezoelectric/electrostrictive substance in Experimental Example 5 had a degree of orientation as high as 73% as determined by the Lotgering method. The piezoelectric/electrostrictive substance in Experimental Example 8 had a degree of orientation were obtained even when the M component was altered. It was also found that the degree of orientation of the piezoelectric/electrostrictive substance can be increased independently of the degree of orientation of the ceramic substrate. Regarding crystal orientation, the results show that the present method of adding a component of a piezoelectric/electrostrictive substance in an excessive amount to orient crystals is more effective than a method of adding a component other than the components of the piezoelectric/electrostrictive substance to increase the degree of orientation.

TABLE 2

| | Basic composition[1] | M component (mol) | | | $Z^2$ | Firing atmosphere[3] | Curvature[4] | Degree of orientation of $1^{st}$ layer (%)[5] | Degree of orientation of piezoelectric/ electroristrictive substance (%)[5] | Bending displacement μm | Number of shorts in insulation test (/100) |
|---|---|---|---|---|---|---|---|---|---|---|---|
| | | Mg | Ni | Zn | | | | | | | |
| Experimental example 1 | 1 | 0.002 | 0 | 0 | 0.002 | A | 0.1 | 20 | 18 | 2.40 | 9 |
| Experimental example 2 | 1 | 0 | 0.02 | 0 | 0.020 | A | 0.3 | 33 | 29 | 2.60 | 5 |
| Experimental example 3 | 1 | 0.01 | 0.02 | 0 | 0.030 | A | 0.3 | 38 | 32 | 2.68 | 4 |
| Experimental example 4 | 1 | 0.04 | 0.02 | 0 | 0.060 | A | 0.5 | 60 | 53 | 2.91 | 3 |
| Experimental example 5 | 1 | 0.08 | 0.02 | 0 | 0.100 | A | 0.8 | 80 | 73 | 3.25 | 1 |
| Experimental example 6 | 1 | 0.4 | 0.02 | 0 | 0.420 | A | 0.3 | 30 | 25 | 2.62 | 5 |
| Experimental example 7 | 1 | 1 | 0.02 | 0 | 1.020 | A | 0.0 | 10 | 5 | 2.16 | 17 |
| Experimental example 8 | 1 | 0 | 0.06 | 0 | 0.060 | A | 0.4 | 60 | 55 | 2.97 | 4 |
| Experimental example 9 | 1 | 0 | 0.02 | 0.04 | 0.060 | A | 0.5 | 65 | 58 | 3.02 | 3 |
| Experimental example 10 | 1 | 0 | 0.02 | 0 | 0.020 | B | 0.0 | 2 | 0 | 2.30 | 15 |
| Experimental example 11 | 1 | 0.08 | 0.02 | 0 | 0.100 | C | 0.0 | 9 | 5 | 2.23 | 17 |
| Experimental example 12 | 2 | 0.002 | 0 | 0 | 0.002 | D | 0.1 | 18 | 15 | 2.42 | 9 |
| Experimental example 13 | 2 | 0 | 0.02 | 0 | 0.020 | D | 0.3 | 32 | 30 | 2.59 | 5 |
| Experimental example 14 | 2 | 0.01 | 0.02 | 0 | 0.030 | D | 0.3 | 37 | 33 | 2.63 | 5 |
| Experimental example 15 | 2 | 0.04 | 0.02 | 0 | 0.060 | D | 0.6 | 62 | 59 | 2.94 | 3 |
| Experimental example 16 | 2 | 0.08 | 0.02 | 0 | 0.100 | D | 0.9 | 83 | 77 | 3.28 | 1 |
| Experimental example 17 | 2 | 0.4 | 0.02 | 0 | 0.420 | D | 0.3 | 28 | 25 | 2.49 | 6 |
| Experimental example 18 | 2 | 1 | 0.02 | 0 | 1.020 | D | 0.0 | 8 | 5 | 2.15 | 18 |
| Experimental example 19 | 2 | 0 | 0.06 | 0 | 0.060 | D | 0.4 | 58 | 55 | 2.98 | 3 |
| Experimental example 20 | 2 | 0 | 0.02 | 0.04 | 0.060 | D | 0.5 | 63 | 58 | 3.03 | 4 |
| Experimental example 21 | 2 | 0 | 0.02 | 0 | 0.020 | E | 0.0 | 3 | 0 | 2.32 | 16 |
| Experimental example 22 | 2 | 0.08 | 0.02 | 0 | 0.100 | F | 0.0 | 11 | 6 | 2.20 | 15 |
| Experimental example 23 | 2 | 0.08 | 0 | 0 | 0.080 | D | 0.5 | 65 | 60 | 2.92 | 3 |
| Experimental example 24 | 3 | 0 | 0.06 | 0 | 0.060 | G | 0.4 | 55 | 50 | 2.75 | 4 |
| Experimental example 25 | 4 | 0 | 0 | 0.04 | 0.040 | H | 0.4 | 60 | 54 | 2.42 | 3 |

[1] See the basic compositions in Table 1.
[2] z value in a × $Pb(M_xNb_y)O_3$ + b × $PbTiO_3$ + c × $PbZrO_3$ + z × MO.
[3] See the compositions of coexisting materials in Table 1.
[4] The ratio of the maximum length of a perpendicular line from a straight line between adjacent triple points of grain boundaries to a grain boundary between the adjacent triple points to the length of the straight line.
[5] The degree of orientation of (100) plane by the Lotgering method.

as high as 55%. In contrast, in Experimental Examples 10, 11, 21, and 22, firing in the presence of an excessive amount of M component (Mg, Ni, or Zn) and a coexisting material having the same composition as the inorganic particle layer did not produce a wavy structure or orientation. In Experimental Examples 1 to 6, Experimental Examples 8 and 9, Experimental Examples 12 to 17, and Experimental Examples 19 and 20, in which the coexisting material contained a smaller amount of $Pb(M_x,Nb_y)O_3$ and a larger amount of $PbTiO_3$ than those in the inorganic particle layer, the results were excellent; that is, the curvature was relatively high, the degree of orientation was high, the bending displacement was large, and the number of shorts in the insulation test was small. These results indicate that when the value z of M component is at least 0.002 and less than 1.020 and when the coexisting material appropriately volatilizes at a rate higher than the inorganic particle layer without contaminating, for example, the substrate, firing in the presence of the coexisting material can produce a wavy structure, excellent orientation, a large bending displacement, and excellent insulation test results. Experimental Examples 23 to 25 show that similar results The present invention contains subject matter related to Japanese Patent Application No. 2008-74427 filed in the Japanese Patent Office on Mar. 21, 2008, Japanese Patent Application No. 2008-152099 filed in the Japanese Patent Office on Jun. 10, 2008, Japanese Patent Application No. 2008-303234 filed in the Japanese Patent Office on Nov. 27, 2008, and Japanese Patent Application No. 2008-317328 filed in the Japanese Patent Office on Dec. 12, 2008, the entire contents of which are incorporated herein by reference.

What is claimed is:

1. A piezoelectric/electrostrictive film element, comprising:
   a ceramic substrate;
   electrodes; and
   a piezoelectric/electrostrictive substance formed on the ceramic substrate or on one of the electrodes disposed on the ceramic substrate, the piezoelectric/electrostrictive substance including a plurality of curved crystal grains that, when viewed in cross-section taken along a plane perpendicular to the particle thickness, have a wavy structure composed of wavy grain boundaries, the wavy grain boundaries including concave portions and convex portions, the concave portions and the convex portions mating with convex portions and concave portions of adjacent crystal grains, respectively, wherein the curvature of the crystal grains, defined by the length of a first straight line between adjacent triple points of grain boundaries divided into the maximum length of a perpendicular line drawn from the first straight line to the grain boundary between the adjacent triple points, is at least 0.1.

2. The piezoelectric/electrostrictive film element according to claim 1, wherein the piezoelectric/electrostrictive substance is produced through a step of forming a piezoelectric/electrostrictive substance, the step including a raw material preparation substep of preparing first inorganic particles that contain as the main component an oxide that has a general formula of $ABO_3$ and satisfies the following Equation 1, wherein z is in the range of $0.002 \leqq z \leqq 0.42$, a first shaping substep of applying the first inorganic particles to the ceramic substrate or to one of the electrodes disposed on the ceramic substrate to form a flat inorganic particle layer, and a first firing substep of firing the inorganic particle layer to grow the crystal grains:

$$a \times Pb(M'_{1/3}, Nb_{2/3})O_3 + b \times PbTiO_3 + c \times PbZrO_3 + z \times M''O \quad \text{(Equation 1)}$$

(wherein a+b+c=1, and M' denotes at least one element selected from Mg, Ni and Zn and M" denotes at least one element selected from Mg, Ni and Zn).

3. The piezoelectric/electrostrictive film element according to claim 2, wherein the piezoelectric/electrostrictive substance is produced through the step of forming a piezoelectric/electrostrictive substance further including a lamination step of performing at least one coating substep and at least one second firing substep, the coating substep involving applying second inorganic particles containing Pb, M, Nb, Zr, and Ti to the fired inorganic particle layer after the first firing substep, the second firing substep involving firing the applied second inorganic particles at a predetermined temperature to grow crystal grains.

4. The piezoelectric/electrostrictive film element according to claim 1, wherein the number of crystal grains in the thickness direction is substantially one.

5. The piezoelectric/electrostrictive film element according to claim 1, wherein the piezoelectric/electrostrictive substance has a thickness of 20 μm or less.

6. The piezoelectric/electrostrictive film element according to claim 1, wherein the piezoelectric/electrostrictive substance is oriented in a predetermined electric field direction.

7. The piezoelectric/electrostrictive film element according to claim 1, wherein the piezoelectric/electrostrictive substance exhibits a bending displacement of at least 10% relative to a non-oriented piezoelectric/electrostrictive substance.

* * * * *